United States Patent
Uchimura et al.

[11] Patent Number: 5,982,256
[45] Date of Patent: Nov. 9, 1999

[54] WIRING BOARD EQUIPPED WITH A LINE FOR TRANSMITTING A HIGH FREQUENCY SIGNAL

[75] Inventors: Hiroshi Uchimura; Takeshi Takenoshita, both of Kokubu, Japan

[73] Assignee: Kyocera Corporation, Kyoto, Japan

[21] Appl. No.: 09/032,244

[22] Filed: Feb. 27, 1998

[30] Foreign Application Priority Data

Apr. 22, 1997 [JP] Japan .................................. 9-104907

[51] Int. Cl.⁶ ...................................................... H01P 3/16
[52] U.S. Cl. .......................................... 333/239; 333/248
[58] Field of Search ................................. 333/238, 239, 333/248

[56] References Cited

U.S. PATENT DOCUMENTS

| | | | |
|---|---|---|---|
| 3,895,435 | 7/1975 | Turner et al. | 333/238 X |
| 4,716,387 | 12/1987 | Igarashi | 333/239 X |
| 4,918,411 | 4/1990 | Staehlin et al. | 333/239 |
| 5,408,053 | 4/1995 | Young | 333/238 X |

FOREIGN PATENT DOCUMENTS

| | | | |
|---|---|---|---|
| 54-131851 | 10/1979 | Japan | 333/238 |
| 55-21665 | 2/1980 | Japan | 333/238 |

*Primary Examiner*—Justin P. Bettendorf
*Attorney, Agent, or Firm*—Loeb & Loeb, LLP

[57] ABSTRACT

A wiring board of the present invention is equipped with a laminated waveguide as a high-frequency signal transmission line. The laminated waveguide is composed of a dielectric substrate, a pair of main conductive layers laminated on the upper surface and the lower surface of the dielectric substrate, a plurality of via-holes extending in a thickness direction in the dielectric substrate so that they electrically connect the pair of the main conductive layers, and a sub-conductive layer provided in the dielectric substrate so that it is parallel to the main conductive layers and is electrically connected to the via-holes, the plurality of the via-holes form two rows extending in a signal transmitting direction with a mutual distance from each other, and in each row, the distance between adjacent via-holes is adjusted to less than ½ of a signal wavelength, a region surrounded with the pair of the main conductive layers and the two rows of the via-holes forms a signal transmitting region, and on both sides in the outside of the signal transmitting region, the sub-conductive layer is provided. The transmittting line by the laminated waveguide which is formed in this wiring board has especially excellent transmitting characteristics of high-frequency signals. In addition, since this wiring board can be easily produced by a laminating technology of ceramics, this wiring board also has excellent productivity.

16 Claims, 20 Drawing Sheets

WIRING BOARD EQUIPPED WITH A LINE FOR TRANSMITTING A HIGH FREQUENCY SIGNAL

BACKGROUND OF THE INVENTION (1) Field of the Invention

This invention relates to a wiring board equipped with a line for transmitting high frequency signals such as microwave and millimetric wave bands.

(2) Description of the Prior Art

As lines for transmitting high frequency signals such as microwaves or millimetric wave bands, waveguides, dielectric waveguides, strip lines and microstrip lines have been conventionally known.

However, these transmission lines have had the following problems.

The strip lines and microstrip lines have a very simple structure and are suitable for production by a laminating technology. But in millimetric wave bands having at least 30 GHz, these lines have a low transmission characteristic.

On the other hand, the waveguides have excellent transmitting chacteristics, but have a defect in respect of their large sizes. For example, a standard rectangular waveguide for 60 GHz has a long diameter of 3.76 mm, and a short diameter of 1.88 mm and is too large for use in a wiring board or a semiconductor package used to transmit microwaves or millimetric wave bands. Among waveguides, a so-called dielectric waveguide in the inside of which an dielectric body is packed has a size of $1/\in^{1/2}$ if the dielectric constant of the dielectric body is $\in$. Accordingly, the dielectric waveguide can decrease its size by using a dielectric body having a high dielectric constant. However, since basically the outside of the dielectric body should be coated with a conductor wall, it was difficult to produce this dielectric waveguide by a laminating technology.

Japanese Laid-Open Patent Publication No. 53711/1994 discloses a waveguide, as described in FIG. 19. In this waveguide, a conductive layer 12 and a conductive layer 13 are provided respectively on the upper surface and the lower surface of a dielectric substrate 11, and the upper conductive layer 12 and the lower conductive layer 13 are electrically connected by a plurality of via-holes 14 which extend in the thickness direction in the dielectric substrate. Furthermore, a plurality of via-holes 14 are arranges in two rows, and a region surrounded by the via-holes 14 and the conductive layers 12 and 13 acts as a line for transmitting signals. By the rows of via-holes 14, a pseudo-conductor wall is formed.

Since such a prior art waveguide line can be prescribed only by processing a plurality of holes in the dielectric substrate, it has excellent advantages in small sizing and productivity. However, since pseudo-conductor walls of a waveguide in this waveguide line are composed of only via-hole rows, the mode which propagates through the waveguide is limited. Even if the distance between via-holes is fully smaller than the signal wavelength, an electromagnetic wave which the conductor wall of via-hole rows can reflect is limited to an electromagnetic wave in which the direction of the electric field is that of the thickness direction of the substrate. Thus, the propagating mode of the electromagnetic wave in the waveguide line is limited to a TEn0 (n: 1, 2, 3 . . . ) mode. In other words, a component in which the direction of an electric field is perpendicular to the thickness direction of the substrate cannot be reflected by the conductor walls due to the via-hole rows. For this reason, the transmission characteristics vary by slight variations of the signal used, or the transmission characteristics are deteriorated in a connecting portion between the waveguide line and another transmission line or a discontinuous portion such as a bent portion. Furthermore, when the frequency number is lowered, the sectional shape of the waveguide increases and simultaneously, the via-hole becomes longer. As a result, the hole processing becomes difficult.

SUMMARY OF THE INVENTION

An object of this invention is to provide a wiring board equipped with a laminated waveguide which can be easily prepared by a lamination technology, and especially to provide a wiring board which has excellent transmitting characteristics of high-frequency signals and is effectively utilized as a transmission line in multilayered board or semiconductor package.

According to this invention, there is provided a wiring board equipped with a laminated waveguide as a high-frequency signal transmission line, wherein the laminated waveguide is composed of a dielectric substrate, a pair of main conductive layers laminated on the upper surface and the lower surface of the dielectric substrate, a plurality of via-holes extending in a thickness direction in the dielectric substrate so that the via-holes electrically connect the main conductive layers, and a sub-conductive layer is provided in the dielectric substrate so that the sub-conductor is parallel to the main conductive layers and is electrically connected to the via-holes; the plurality of the via-holes form two rows extending in a signal transmitting direction with a mutual distance from each other, and the distance between adjacent via-holes in each row is adjusted to less than ½ of a signal wavelength, a region surrounded by the pair of the main conductive layers and the two lines of the via-hole conductors forms a signal transmitting region, and on both sides in the outside of the signal transmitting region, the sub-conductive layer is provided.

The wiring board of this invention uses a laminated waveguide as the high-frequency signal trasnsmitting line. But this laminated waveguide is different from a conventionally known dielectric waveguide shown in FIG. 19 where rows of via-holes partitioning the signal transmission line are electrically connected by the sub-conductive layer formed in the outside of the signal transmitting region. In the present invention, both sides of the signal transmitting region are formed in the formof lattices of via-holes and sub-conductive layer. Accordingly, since an electromagnetic wave in any direction can be reflected, leakage of electromagnetic waves from both sides is effectively prevented. As a result, the wiring board of this invention shows excellent transmitting characteristics of signals in a high-frequency region ranging widely from microwaves to millmetric waves. In addition, this wiring board can be easily produced by an ordinary laminating technology, provides excellent productivity, and can be fully applied to wiring boards or semiconductor package having a high density.

According to this invention, there is further provided a wiring board equipped with a laminated waveguide as a high-frequency signal transmission line, wherein the laminated waveguide has a laminated structure composed of dielectric layers and conductive layers laminated alternately, a plurality of via-holes are extending parallel in a laminating direction and are circumferentially spaced from each other, each conductive layer is positioned at the outside of the via-holes and electrically connected the via-holes, and by a region surrounded with these via-holes and the conductive layers, high-frequency signals are transmitted in a laminated direction.

The wiring board of this type has an important characteristic that the laminated waveguide used as the high-frequency signal transmission line has such a structure that in a laminating direction, that is, in a direction perpendicular to the surface of the board, high-frequency signals are transmitted. In known wiring boards, the transmission of signals in a perpendicular direction is carried out by electrically connecting transmission lines for transmitting signals in the surface direction of the board by using the signal via-holes. Accordingly, when the frequency number of trasmitting signals becomes high and enters into a microwave band or a millemetric wave band, reflection of signals occurs due to the mismatching of impedance at the signal via-holes, or radiation of electromagnetic waves occurs in the signal via-holes whereby the transmitting characteristics are deteriorated abruptly. Especially in a wiring board in which at least ten dielectric layers are laminated, when transmission lines are electrically connected to each other by using signal via-holes which go through these dielectric layers, the deterioration of trasmitting characteristics becomes remarkable. The wiring board of this invention having the above type transmits signals in a laminating direction (perpendicular direction) without using the signal via-holes, and even when the high-frequency signals are transmitted, transmitting characteristics are not deteriorated.

DETAILED DESCRIPTION OF THE INVENTION

The invention will be described below based on the accompanying drawings.

Structure of a Laminated Waveguide

Figure 1:
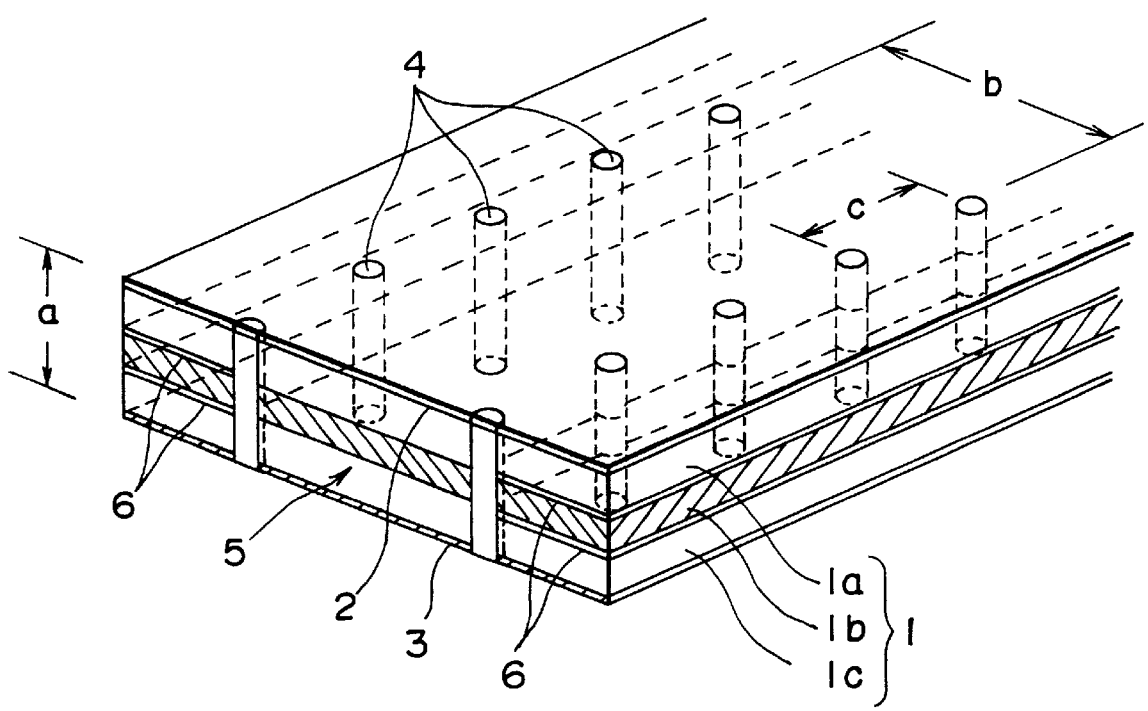
FIG. 1 is a rough perspective view showing one example of a laminated waveguide used in the wiring board of this invention.

In FIG. 1 showing one example of the laminated waveguide used in the wiring board of this invention, this waveguide is roughly composed of a dielectric substrate 1, main conductive layers 2 and 3 provided on the upper surface and the lower surface of the dielectric substrate 1, and a number of via-holes 4 which electrically connect the main conductive layers 2 and 3. The via-holes 4, as shown in the drawings, are arranged in two rows, the region 5 surrounded the row of these via-holes 4 and the main conductive layers 2 and 3 arranged parallel to each other constitutes a signal transmitting region. A region 5 having a sectional area expressed by a×b in which a is the thickness (corresponding to the space between the main conductive layers 2 and 3) of the dielectric substrate 1 and b is the distance between the lines of the via-holes 4, becomes a transmission line, and signals are transmitted in a surface direction along the rows of the via-holes 4.

In this invention, a sub-conductive layer 6 is provided in the dielectric substrate 1. This sub-conductive layer 6 is arranged in parallel to the main conductive layers 2 and 3 on both sides of the outside of the transmission line 5, and electrically connected to the via-hole 4. By providing the sub-conductive layer 6 in this way, both sides of the transmission line 5 form a lattice comprising the rows of the via-holes 4 and the sub-conductive layer 6. Therefore, the both sides of the transmission line 5 have a high shielding effect against the electromagnetic wave and the transmission line 5 shows excellent transmitting characteristics. In this case, as far as the sub-conductive layers 6 are provided on both sides of the transmission line 5, the number of the sub-conductive layers 6 is not limited. For example, FIG. 1 shows two sub-conductive layers 6 on each side of the transmission line 5, but one sub-conductive layer 6 may be provided on each side. However, to obtain a sufficient electromagnetic shielding effect, it is usual that the distance between the sub-conductive layers 6, or the distance between the sub-conductive layer 6 and the main conductive layer 2 or 3 should be ¼ of a signal wavelength or below.

In FIG. 1, many via-holes 4 are formed in two rows. Of course, they may be arranged in 4 or 6 rows or greater rows. When the number of rows of via-holes 4 becomes larger, pseudoconductor walls on both surfaces of the transmission line 5 become multiplex and the shielding effect against the electromagnetic waves increases. Furthermore, the diameter of the via-hole is usually about 50 to 300 $\mu$m.

In such a laminated waveguide, the thickness (a) of the dielectric substrate 1 is not particularly limited. But when the waveguide is used in a single mode, the thickness (a) may be adjusted to about b/2 or about 2b with regard to the distance (b). In each row of via-hole 4, the distance (c) between adjacent via-holes 4 should be adjusted to less than ½ of the signal wavelength $\lambda$c. Between the main conductive layers 2 and 3 provided parallel to each other, TEM waves (transverse electromagnetic waves) can propagate. Accordingly, when the distance (c) between the via-holes 4 is at least ½ of the signal wavelength $\lambda$c, even if the electromagnetic waves are supplied to the transmission line 5, leakage occurs between the via-holes 4, and the electromagnetic waves do not propagate along the transmission line 5. On the other hand, when the distance (c) is less than ½ of the signal wavelength $\lambda$c, the electromagnetic waves are reflected from the via-holes 4, and propagate along the transmission line 5.

The dielectric substrate 1 may be any desired material which functions as a dielectric body and has characteristics of not preventing the transmission of high-frequency signals. In view of the accuracy and the ease of production in forming transmission lines, dielectric ceramic materials composed of alumina, mullite, aluminum nitride, silicon nitride, or silica, glass, or glass-ceramics composed of composites formed of glass and ceramic fillers may preferably be used. When the dielectric constant of the dielectric substrate 1 is $\in$, the size of the waveguide (the cross-sectional area of the transmission line 5) usually becomes the size of $1/\in$ of an ordinary waveguide. Accordingly, when the dielectric substrate 1 is composed of a material having a higher dielectric constant, its size can be made smaller. For example, this wiring board can have a size which can used as transmission line of a multilayered wiring board or a semiconductor package on which a wiring is formed in a high density. In this regard, among dielectric ceramics, those having a dielectric constant of about 4 to 100 are preferred. Furthermore, in order to transmit high-frequency signals, the dielectric ceramics are desirably paraelectrics because generally, ferroelectricity ceramics have a large dielectric loss in a high frequency range, and the transmission loss becomes large.

Generally, the line width of a wiring layer formed in a wiring board or package is 1 mm at the largest. Accordingly, when a dielectric substrate 1 composed of a material having a dielectric constant of 100 is used, and the above-mentioned laminated waveguide is used so as to provide an electromagnetic field distribution in which the magnetic field is wound in parallel on the surface of an upper portion (namely, the upper portion becomes an H surface), the smallest frequency number of a transmissible signal can be calculated as 15 GHz, and the above waveguide can be applied to trasmit a signal having a frequency in a microwave region. On the other hand, when a resin is used as the dielectric substrate 1, since the dielectric constant of the resin is about 2, if the line width is 1 mm, there is a limitation that only a signal having a frequency of at least about 100 GHz can be used.

Among the paraelectricity ceramics, materials such as alumina or silica type ceramics, glass or glass-ceramics having a very small dielectric loss tangent are especially preferred. When signals are transmitted by a waveguide, the transmission loss is divided into a loss by a conductor and a loss by a dielectric body. Since the loss by the dielectric body is considerably larger than the loss by the conductor, the loss by the dielectric body $\alpha$ (dB/m) per unit length is expressed by the following formula (1)

$$\alpha = 27.3 \cdot \tan\delta / \lambda / \{1 - (\lambda/\lambda c)^2\} \tag{1}$$

tan $\delta$: delectric loss tangent $\lambda$: wavelength in the dielectric body $\lambda$c: cut-off wavelength of waveguide line In a standardized rectangular waveguide (WRJ series), the value of $\{1-(\lambda/\lambda c)^2\}^{1/2}$ in the formula (1) is about 0.75. Accordingly, in order that transmission loss which can be put to practical use is prescribed to −100 (dB/m) or below, the dielectric body should be selected to satisfy the following formula (2):

$$f \in^{1/2} \tan\delta \leq 0.8 \tag{2}$$

wherein f is a frequency (GHz) used.

Accordingly, in the present invention, materials such as alumina or silica type ceramics, glass or glass-ceramics having a very small dielectric loss tangent are preferably used as the dielectric substrate 1 among the paraelectricity ceramics.

As the main conductive layers 2 and 3, the via-holes 4, and the sub-conductive layer 6, high melting metals such as tungsten and molybdenum and low melting metals such as copper, gold, silver and aluminum are preferably used. To lower the loss at the time of transmitting high-frequency signals, at least one metal selected from copper, gold and silver is most preferably used.

In the above-mentioned laminated waveguide, the dielectric substrate 1 may be composed of a plurality of dielectric layers to provide the sub-conductive layer 6. For example, in an example of FIG. 1, the sub-conductive layers are provided in two layers on both sides of the transmission line 5, and therefore, the dielectric substrate 1 is composed of three dielectric layers 1a, 1b and 1c.

These dielectric layers 1a, 1b and 1c may all be composed of the same dielectric body. In the present invention, the dielectric layer 1b at the central portion is preferably composed of a material having a higher dielectric constant than the dielectric layers 1a and 1c located at an upper position and a lower position. When a signal is transmitted by a waveguide provided with the dielectric substrate 1 as shown in FIG. 1, the transmission loss is classfied as a loss by a dielectric body and a loss by a conductor. When the dielecric body 1b in a central portion is composed of a material having a high dielectric constant, the transmission loss by a conductor can be lowered.

For example, when the transmission line 5 is used in a TE (transverse electric) 10 mode of which the H surface is the laminated surface, if f is the frequency of a signal to be transmitted, the current flowing on the H surface does not depend on the frequency f, but since the surface resistance is proportional to $f^{1/2}$, the loss in the H surface becomes high in proportion to $f^{1/2}$. On the other hand, since the current flowing through the E surface parallel to the electric field is inversely proportional to $f^2$, the loss in the E surface becomes $f^{-3/2}$ and tends to decrease as the frequency becomes high. Accordingly, if the dielectric layer 1b in the central portion has a high dielectric constant, the electromagnetic distribution is concentrated in the central portion having a high dielectric constant and the density of the electromagnetic field near the conductive layer of the H surface (the loss increases in proportion to $f^{1/2}$) decreases. Simultaneously, owing to the shortening effect of the wavelength, the density of the electromagnetic field near the conductive layer of the E surface decreases. As a result, by increasing the dielectric constant of the dielectric layer 1b in the central portion, it is possible to decrease the loss by the conductor and to further increase the transmitting characteristics.

In an example of FIG. 1, since the dielectric substrate 1 is composed of the dielectric layers 1a, 1b and 1c, the explanation was given by taking the increase of the dielectric constant of the dielectric layer 1b as an example. For example, when the dielectric substrate 1 is composed of at least 4 dielectric layers, the layer whose dielectric constant is to be made high is not limited to one layer, but the dielectric constants of a plurality of layers may be increased.

In the laminated waveguide having the above-mentioned structure, the transmission passage 5 extends in the direction of a laminated surface, and therefore, the transmitting direction becomes the direction of the laminated surface, but the transmitting direction may be a perpendicular direction. An example of a wiring board using a laminated waveguide having such a structure is shown in FIG. 2.

Figure 2:
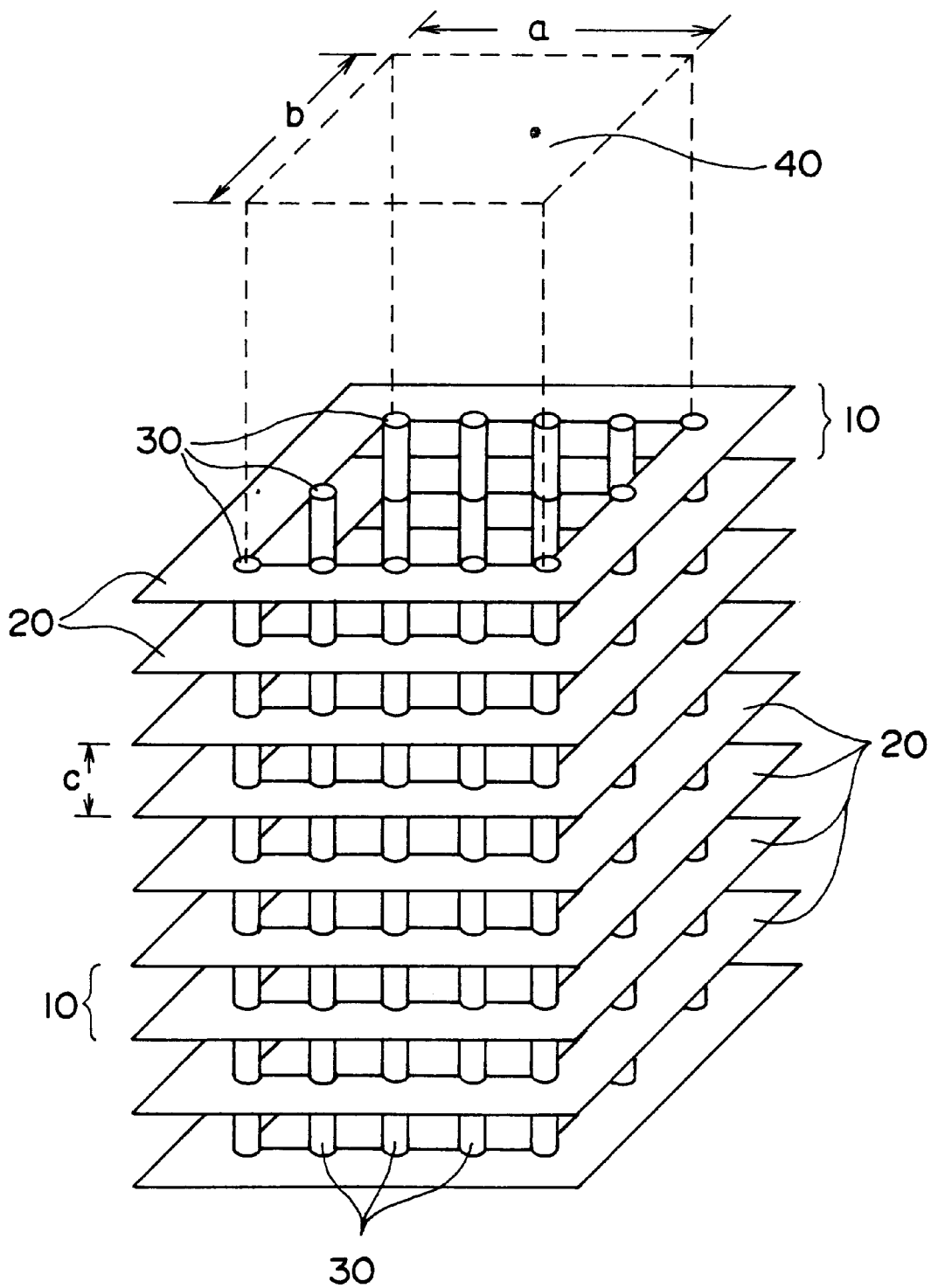
FIG. 2 is a rough perspective view showing an example of a laminated waveguide having a different type from FIG. 1.

In the wiring board of FIG. 2, a plurality of dielectric layers 10 and a plurality of conductive layers 20 are alternately laminated. A waveguide is formed from these layers and a plurality of via-holes 30 extending in the laminating direction. The via-holes 30 are arranged circumferentially, and the conductive layers 20 are provided outside of the circumferentially arranged via-holes 30 and are electrically connected to the via-holes 30.

Accordingly, in this wiring board, the region 40 surrounded by the via-holes 30 constitutes a transmission line. The transmission line 40 shown in FIG. 2 has a sectional area of a×b and extends in a perpendicular direction (laminating direction). In such transmission line 40, psedudo-conductor walls are formed by the lattice of the conductive layers 20 and the via-holes 30, and signals are transmitted in the perpendicular direction (laminating direction). Accordingly, in the same way as in FIG. 1, the distance (corresponding to the thickness of the dielectric layer 10) between adjacent conductive layers 20 should be adjusted to less than ½ of the signal wavelength.

When the transmission of a signal in a perpendicular direction is performed by electrically connecting, via signal via-holes, between transmission lines through which the signal is transmitted in the plane direction of the substrate, as previously dscribed, mis-matching of impedance or the radiation of electromagnetic waves causes the deterioration of the transmitting characteristics, especially in high-frequency band. However, since in an example of FIG. 2, by the same theory as the laminated waveguide in FIG. 1, the transmission of a signal is carried out in a laminating direction (perpendicular direction) the transmitting characteristics are not deteriorated, and it is possible to transmit the high-frequency signal in the laminating direction.

Figure 3:
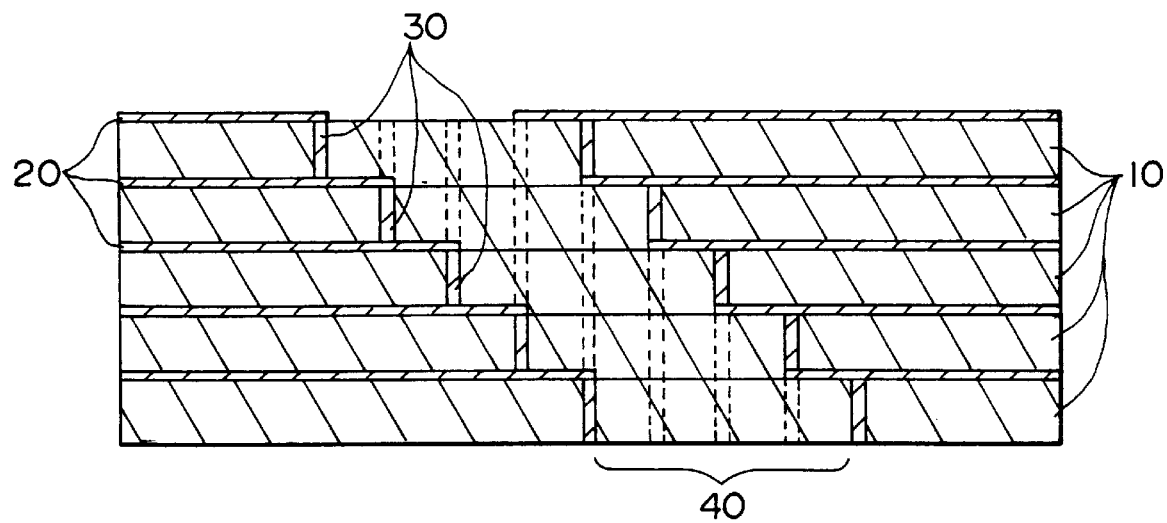
FIGS. 3 and 4 are views showing modified examples of the laminated waveguides different types from FIG. 2.
Figure 4:
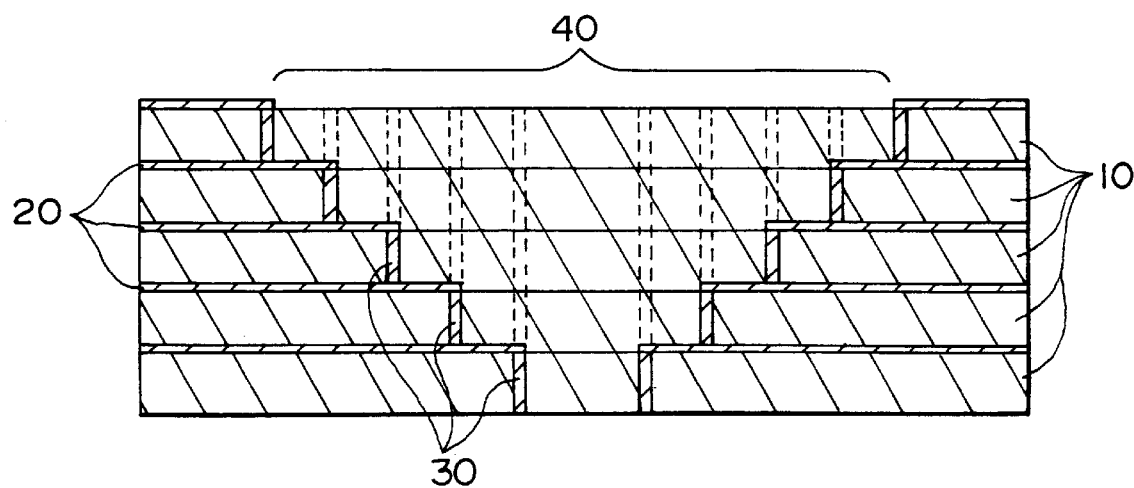

In an example of FIG. 2, the transmission line 40 is the form of an erect square pole, but as shown in FIG. 3, the transmission line 40 may be inclined or, as shown in FIG. 4, it may be in a form with an increasing sectional area as it goes upwardly.

Furthermore, in the wiring boards shown in FIGS. 1 and 2, the sectional shape of the transmission line 5 or 40 is rectangular. This sectional shape is not limited, and includes various shapes such as a circle or an ellipse.

Connection of a Transmission Line Due to a Laminated Waveguide to Another Transmission Line The laminated waveguide used as a transmission line in the wiring board of this invention may be combined with other transmission lines, such as a microstrip line, a coplanar line and other laminated waveguide. These other transmission lines may be formed in a wiring board on which the laminated waveguide of FIG. 1 is formed, or they may be formed in another wiring board.

For example, in the laminated waveguide in which the main conductive layers 2, 3 become the H surface, via-holes (to be referred to as the connecting via-holes) are extended from the terminal portion of another transmission line, and these connecting via-holes are inserted into the transmission line of the above-mentioned laminated waveguide, whereby another transmission line may be combined with the above-mentioned laminated waveguide.

Figure 5:
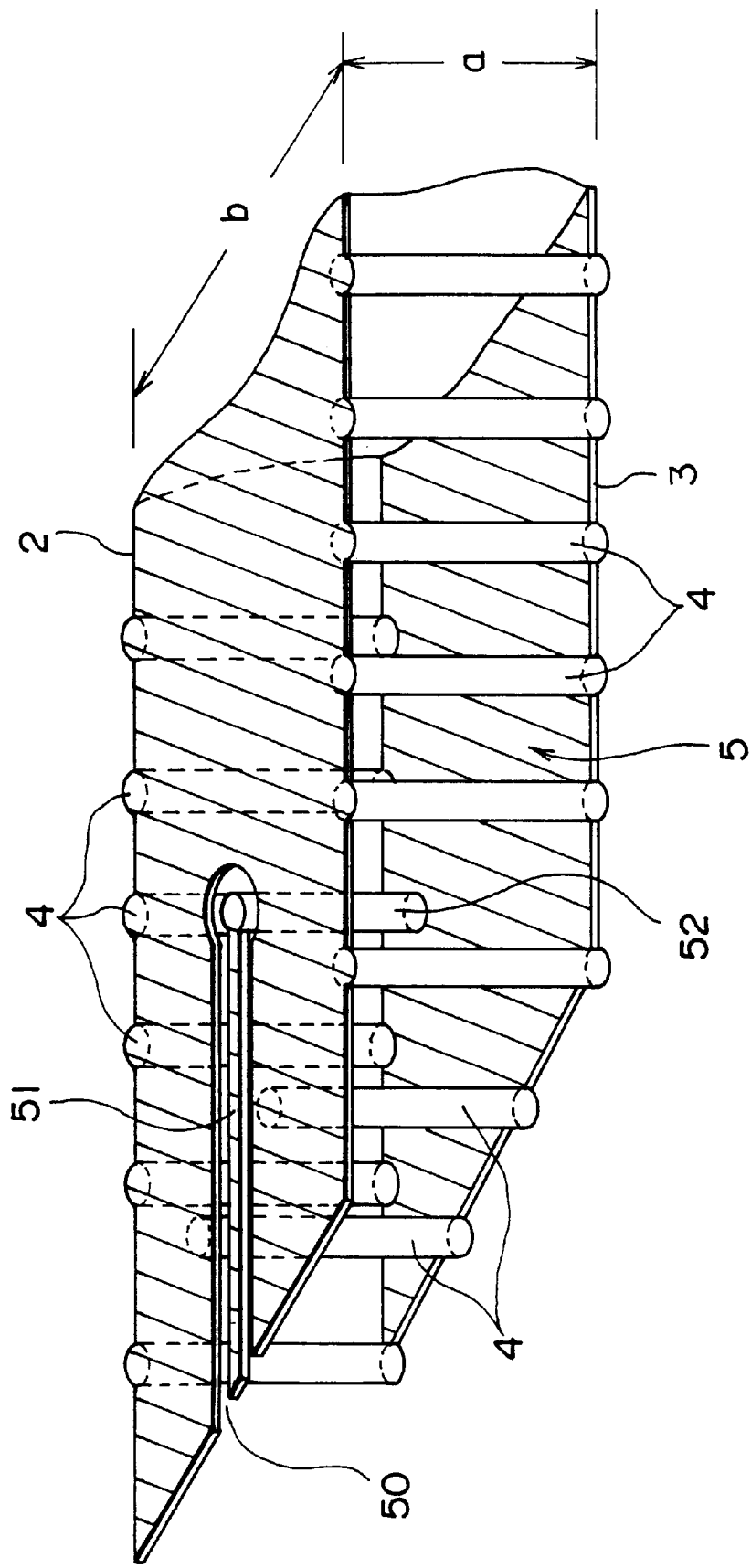
FIG. 5 shows a view showing an example of a trasmitting line by a laminated waveguide using a connecting via-hole in combination with a coplanar line.

FIG. 5 shows an example of a combination of a coplanar line and a laminated waveguide of FIG. 1, and depicts essential portions of the combined structure. The sub-conductive layers are omitted in this figure.

In FIG. 5, a notch 50 is formed in the main conductive layer 2, and a linear conductor passage 51 is formed in the notch 50. This linear conductor passage 51 forms a coplanar line in which a ground conductor is the main conductive layer 2, and a signal may be transmitted by the coplanar line. The width of the of the linear conductor passage 51 is 50 to 500 μm, the distance between the linear conductor passage 51 and the main conductive layer 2 as a ground conductor ranges from about 50 to 500 μm, and generally, the characteristic impedance is prescribed at about 50 ohms.

According to this invention, the via-holes (connecting via-hole) 52 extends from the tip of the linear conductor passage 51 to the transmission line 5 formed in the laminated waveguide. By this extension, a structure is generated in which the coplanar line and the laminated waveguide are combined.

In this case, the lower end portion of the connecting via-hole 52 should not contact the conductive layer 3 of the lower side of the transmission line 5. When the connecting via-hole 52 is connected electrically to the conductive layer 3, the transmission characteristics will be lowered. Accordingly, when the dielectric substrate 1 is composed of the three dielectric layers 1a, 1b and 1c as shown in FIG. 1, it is desirable to form the connecting via-hole 52 as far as the dielectric layers 1a and 1b and not to form the connecting via-hole 52 at the dielectric layer 1c. When the connecting via-hole 52 extends as far as the dielectric layer 1c, it is desirable to form a hole in a portion of the conductive layer 3 where the lower end of the connecting via-hole 52 is located so that the connecting via-hole 52 should not be connected electrically to the conductive layer 3.

Figure 23:
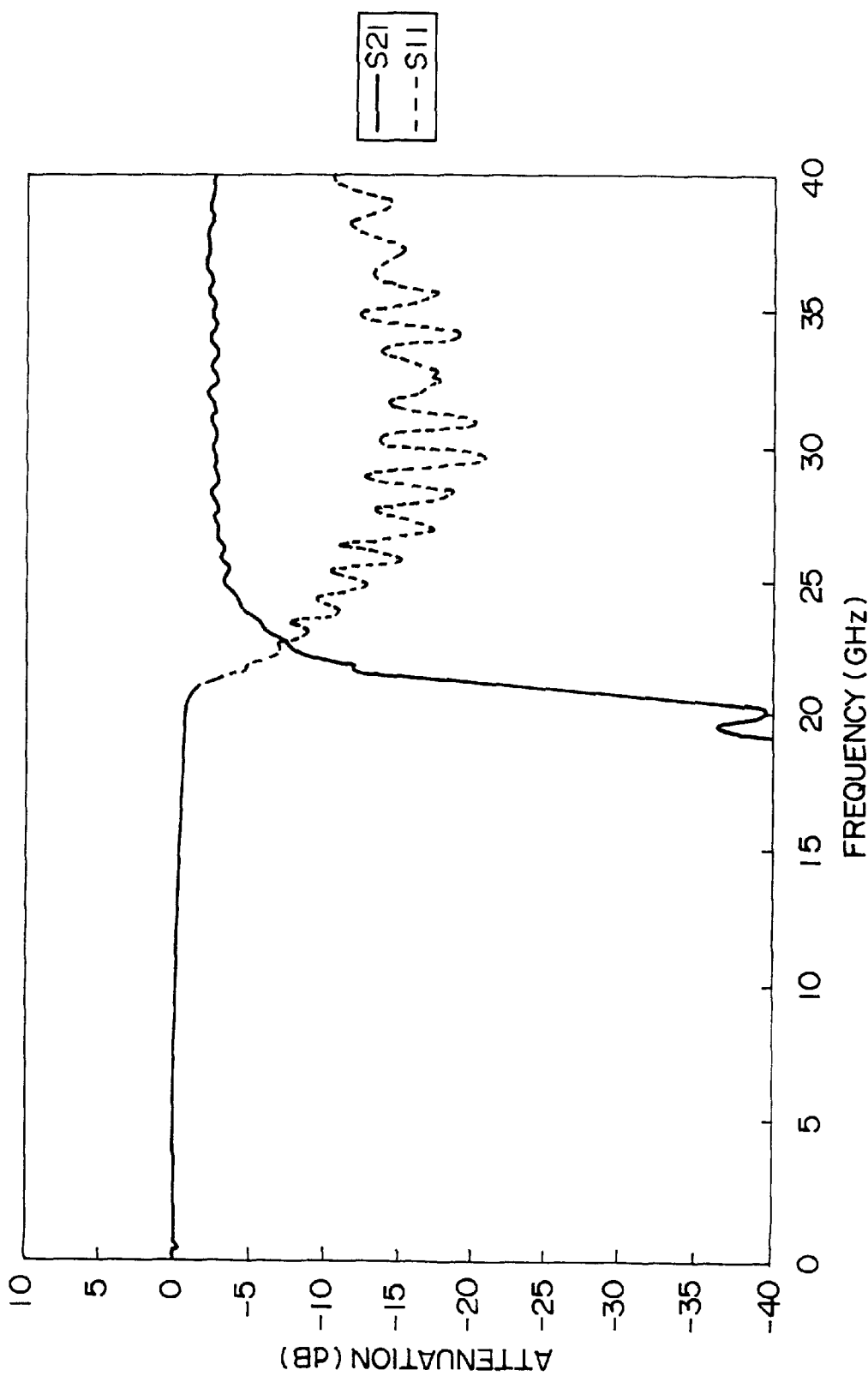
FIG. 23 is a view showing the transmission characteristics in a wiring board obtained by combining a coplanar line of FIG. 5 with a transmission line by a laminated waveguide.

As in FIG. 5, in an embodiment in which the coplanar line and a transmission line by the laminated waveguide are combined, there is formed a structure in which a large main conductive layer 2 is formed over the upper surface of the connecting via-hole 52. As a result, this connecting via-hole 52 can work as a monopole antenna having a wavelength of ¼. If the length of the connecting via-hole 52 is prescribed so that it becomes ¼ of a signal wavelength to be used, electromagnetic waves propagated on the coplanar line are radiated in the transmission line 5 due to the laminated waveguide by means of the antenna by the connecting via-hole 52. Accordingly, if the thickness (a) of the transmission line 5 (the thickness of the dielectric substrate 1) is designed as to be about b/2 (b=the width of the line 5), electromagnetic waves of a TE10 mode in which the upper and lower surfaces of the transmission line 5 form an H surface (an electromagnetic field distribution in which the electromagnetic field is wound parallel to the upper and lower surfaces) are propagated as a main mode. Accordingly, the electromagnetic waves of the TE10 mode are well combined with electromagnetic waves radiated from the connecting via-hole 52 acting as an antenna whereby the high-frequency signals are propagated in the transmission line 5. Incidentally, FIG. 23 show the results of measuring the transmission characteristics of a wiring board obtained by combining the coplanar line and a transmission line by the laminated waveguide as shown in FIG. 5. It is seen from FIG. 23 that in a wavelength region of 25 to 40 GHz, an excellent transmitting characteristic of S21 being about −2.5 dB was obtained.

Figure 6:
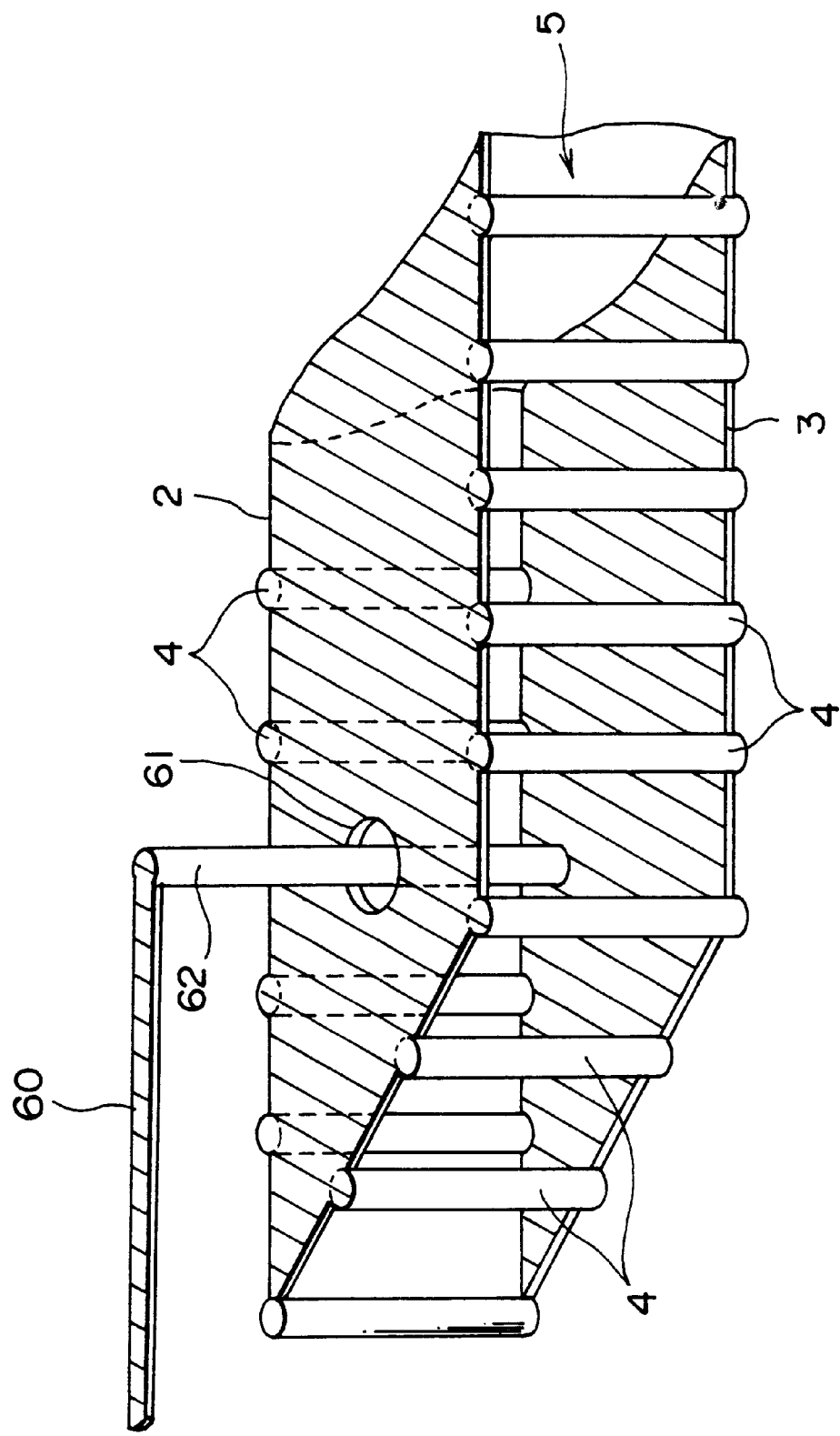
FIG. 6 shows a view showing an example of a transmission line by a laminated waveguide using a connecting via-hole in combination with a microstrip line.

FIG. 6 shows an example of combining a transmission line due to a laminated waveguide by using the connecting via-hole with a microstrip line.

In FIG. 6 (in view of the preparation of drawings, all dielectric body layers and sub-conductive layers are omitted), a dielectric layer is formed on the main conductive layer 2 in the upper surface constituting the trasmission line 5 by the laminated waveguide, and a linear conductor passage 60 is formed on the dielectric layer. Since this linear conductor passage 60 is provided on the upper side of the main conductive layer 2 via the dielectric layer, a microstrip line is formed.

On the other hand, a hole 61 is formed in the main conductive layer 2, and a connecting via-hole 62 extends through this hole 61 from the tip of the conductor passage 60 into the transmission line 5. Accordingly, the microstrip line is combined with the transmission line 5 by the laminated waveguide. In the case of this combining method, in the same way as in FIG. 5, the connecting via-hole 62 is provided not to connect electrically to the lower main conductive layer 3. Furthermore, by the hole 61, the connecting via-hole 62 is provided not to connect electrically to the upper main conductive layer 2. By adjusting the length of the portion of the connecting via-hole 62 penetrated into the transmission line 5 to ¼ of the signal wavelength, the trasmitting via-hole 62 may function effectively as a monopole antenna of ¼ wavelength.

In the case of the combining means shown in FIG. 6, an electromagnetic field of electromagnetic waves propagated on a microstrip line through a linear conductor passage 60 are electromagnetically combined with a magnetic field propagated on the transmission line 5 by the laminated waveguide because the connecting via-hole 62 acts as an antenna. As a result, signals from the microstrip line can be transmitted into the transmission line 5 by the laminated waveguide with a low loss.

Figure 7:
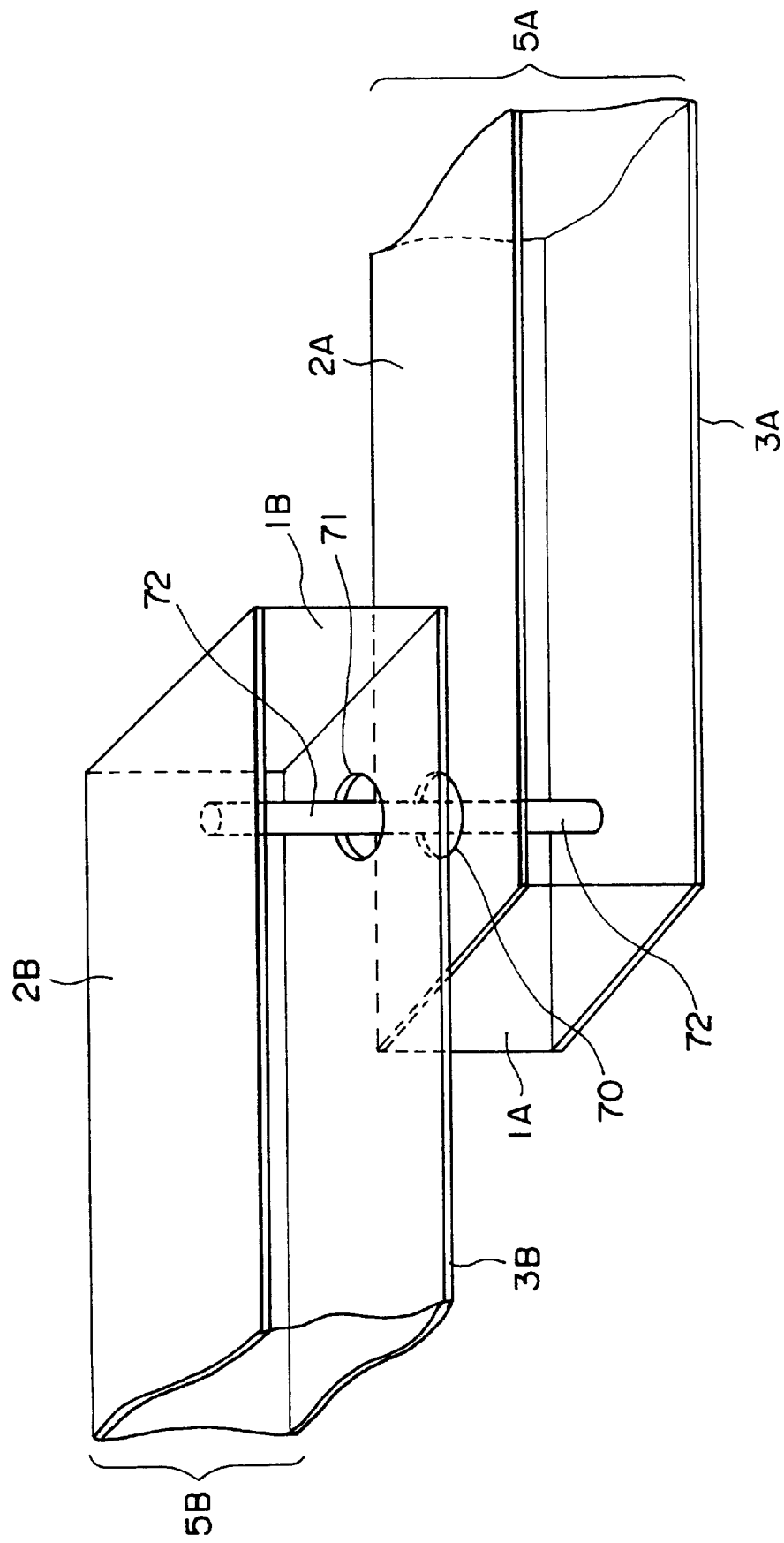
FIG. 7 shows a view showing an example of a combination of transmission lines by a laminated waveguide using connecting via-holes.

FIG. 7 shows an example of combining transmission lines by a laminated waveguide. In FIG. 7, via-holes constituting the transmission lines and sub-conductive layers are omitted.

In FIG. 7, the transmission lines 5A and 5B by the laminated waveguide are arranged so that the end portions of these lines are overlapped through the dielectric layers. The dielectric layer and the main conductive layers constituting the lower transmission line 5A are shown by 1A, 2A and 3A, and the dielectric layer and the main conductive layers constituting the upper transmission line 5B are shown by 1B, 2B and 3B. In the upper main conductive layer 2A of the transmission line 5A and the lower conductive layer 2B of the transmission line 5B, the holes 70 and 71 are formed respectively. A connecting via-hole 72 extends between the transmission lines 5A and 5B through these holes 70 and 71. The connecting via-hole 72 is provided so as not to electrically connect to the main conductive layers of the transmission lines 5A and 5B. Accordingly, when the dielectric layers 1A and 1B of the transmission lines 5A and 5B have a three-layer structure as shown in FIG. 1, the connecting via-hole 72 does not extend to the dielectric layer (1C) in the lowermost layer (1C), and the connecting via-hole 72 does not extend to the dielectric layer (1a) in the uppermost layer.

In the combined structure shown in FIG. 7, the connecting via-hole 72 acts as a monopole antenna in the same way as in FIGS. 5 and 6, and by an electromagnetic field coupling, signals can be transmitted with a low loss between the transmission lines 5A and 5B.

Furthermore, in FIG. 7, the dielectric layers 1A and 1B constituting the transmission lines 5A and 5B may be formed from a material which is most convenient to constitute the transmission lines, but both transmission lines may not always be formed from the same dielectric material. For example, when the above-mentioned trasnmission line 5A is used as a signal circuit, the dielectric layer 1A is formed from a dielectric material having a high dielectric constant to make wiring in a high density possible. When the other transmission line 5B is used as a slot antenna for a waveguide, radiation characteristics can be improved by forming the dielectric layer 1B from a dielectric material having a small dielectric constant. Furthermore, in FIG. 7, the main conductive layers 3B, 2A in the transmission lines 5A, 5B may be a common layer.

FIGS. 5 to 7 show an example of combining the transmission line 5 in which the main conductive layers 2, 3 become the H surface, with another transmission line by inserting the connecting via-hole into the transmission line 5 by the laminated waveguide from the side of the main conductive layer 2 or 3. However, when the main conductive layers 2, 3 become the E surface, it is also possible to combine by inserting the terminal portion of the other transmission line from the side of the sub-conductive layer 6 into the transmission line 5.

Figure 8:
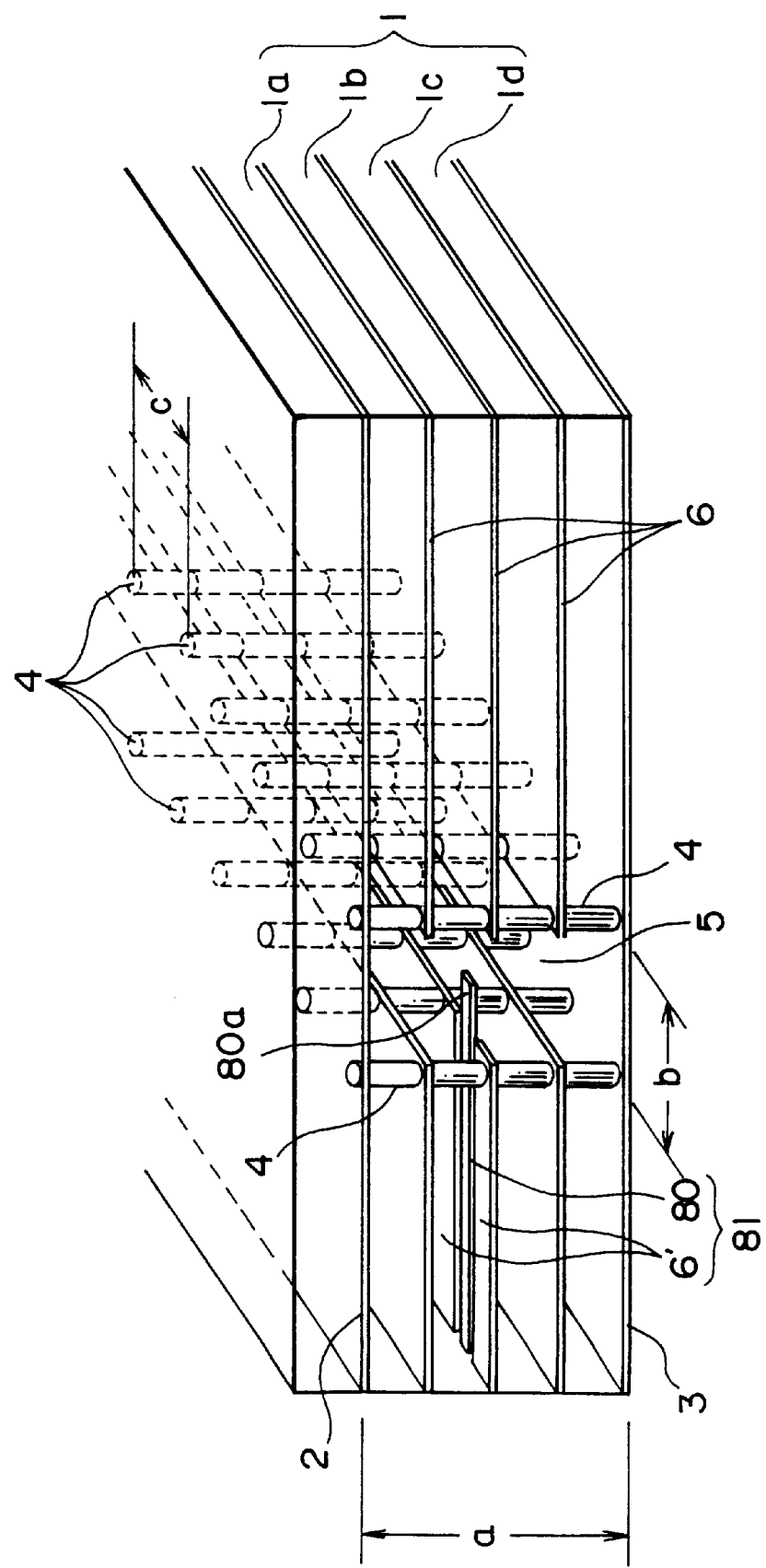
FIG. 8 is a rough perspective view of an example of a combined structure obtained by inserting a termination portion of a coplanar line into a tramsmitting line by a laminated waveguide.
Figure 9:
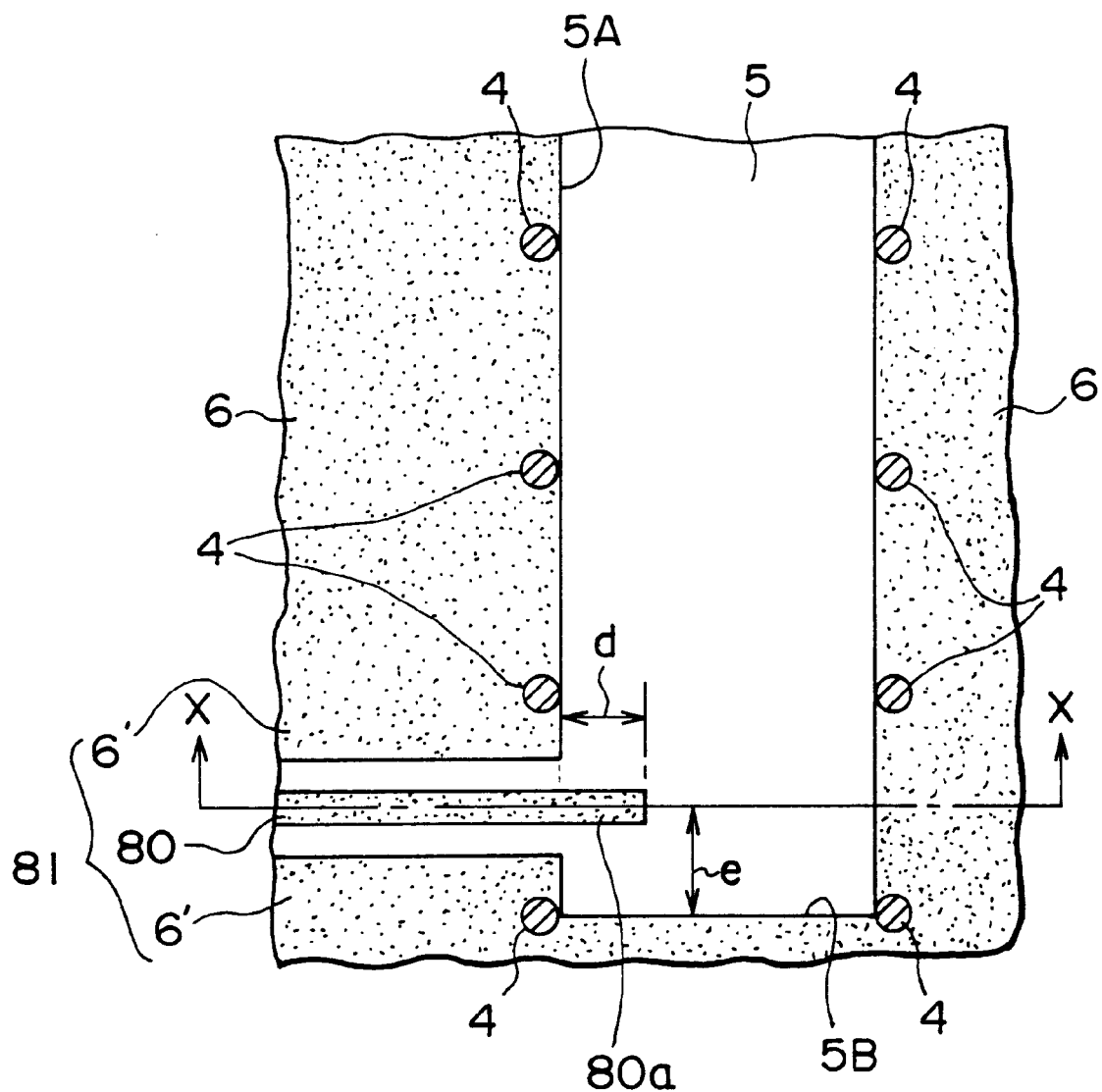
FIG. 9 is a flat sectional view showing the combination state of FIG. 8.

FIG. 8 is a perspective view showing an example of combining trasmission lines by inserting the terminal portion of the coplanar line into the transmission line 5, and FIG. 9 is its flat sectional view.

As shown in FIG. 8, in this laminated waveguide, the dielectric substrate 1 between the main conductive layers 2 and 3 is composed of four dielectric layers 1a, 1b, 1c and 1d. The sub-conductive layer 6 is formed between the dielectric layers, the transmission line 5 having a cross sectional area of a×b is formed. A dielectric layer is formed on the main conductive layer 6 too. In FIG. 8, a portion (in FIG. 8, a sub-conductive layer positioned between dielectric layers 1b and 1c) of a sub-conductive layer 6 positioned on one side of the transmission line 5 is divided into two portions 6' and 6' by a slit-like groove, and a linear conductor passage 80 extends in the groove. This linear conductor passage 80 forms a coplanar line 81 using sub-conductive layers 6' and 6' as a ground conductor. In the coplanar line 81, in the same way as in FIG. 5, the width of the linear conductor passage 80 is 50 to 500 μm and the distance between the conductor passage 80 and the sub-conductive layer 6' which is a ground conductor is adjusted to 50 to 500 μm, for example, to a characteristic impedance of about 50 ohms.

As is clear from FIG. 9 especially, a tip portion 80a (to be referred to as a stub) of the linear conductor passage 80 in the coplanar line 81 is inserted into the transmission line 5 by the laminated waveguide from a side surface 5A, whereby the coplanar line 81 is combined with the transmission line 5.

According to the combined structure shown by FIGS. 8 and 9, an electric signal propagated on the coplanar line 81 vibrates the stub 80a of the linear conductor passage 80, and generates a concentric magnetic field about the stub 80a as a center. Then, if the distance of the via-hole in the transmission line 5 is adjusted to about a/2 (a=thickness of the transmission line 5), the magnetic field generated by the vibration of the stub 80a is electromagnetically coupled with the electromagnetic waves of a TE10 mode propagated on the transmission line 5. Thus, the coplanar line 81 is well connected to the transmission line 5 by the laminated waveguide.

If the length of the stub 80a is adjusted to about ¼ of the central wavelength of an electric signal to be propagated, because the stub 80a shows the same action as the monopole antenna ¼ wavelength, the electric signal with a central wavelength can be radiated more efficiently into the transmission line 5. However, actually, a capacitance is generated between the stub 80a and the sub-conductive layer 6 on the left side of FIG. 9 and an inductance is generated between the stub 80a and the lower sub-conductive layer 6 (the main conductive layer 3 as the case may be). To consider these factors, the length d of the stub 80a should be finely adjusted. Accordingly, in practice, it is preferred that the length d of the stub 80a should be adjusted to a/4 to a/3.

If the distance e between the stub 80a and the end surface 5B of the transmission line 5 is adjusted to about ¼ of the wavelength of the electrical signal propagated in the line 5, an electromagnetic wave which is reflected at the end surface 5B and becomes an anti-phase is superimposed on an electromagnetic wave which proceeds without reflection in the same phase, and therefore, good transmitting characteristics can be obtained. However, in this case, the capacitance and the impedance which are generated in the same way must be considered, and the distance e should be finely adjusted. Hence, in practice, it is preferred that this distance e should be adjusted to a/4 to a/3.

In the embodiments of FIGS. 8 and 9, the linear conductor passage 80 of the coplanar line 81 is inserted into the transmission line 5 from the side surface 5A of the transmission line 5, but this linear conductor passage 80 may be inserted from the end surface 5B of the transmission line 5. In this case, the mode of the signal to be propagated becomes the TE11.

Figure 10:
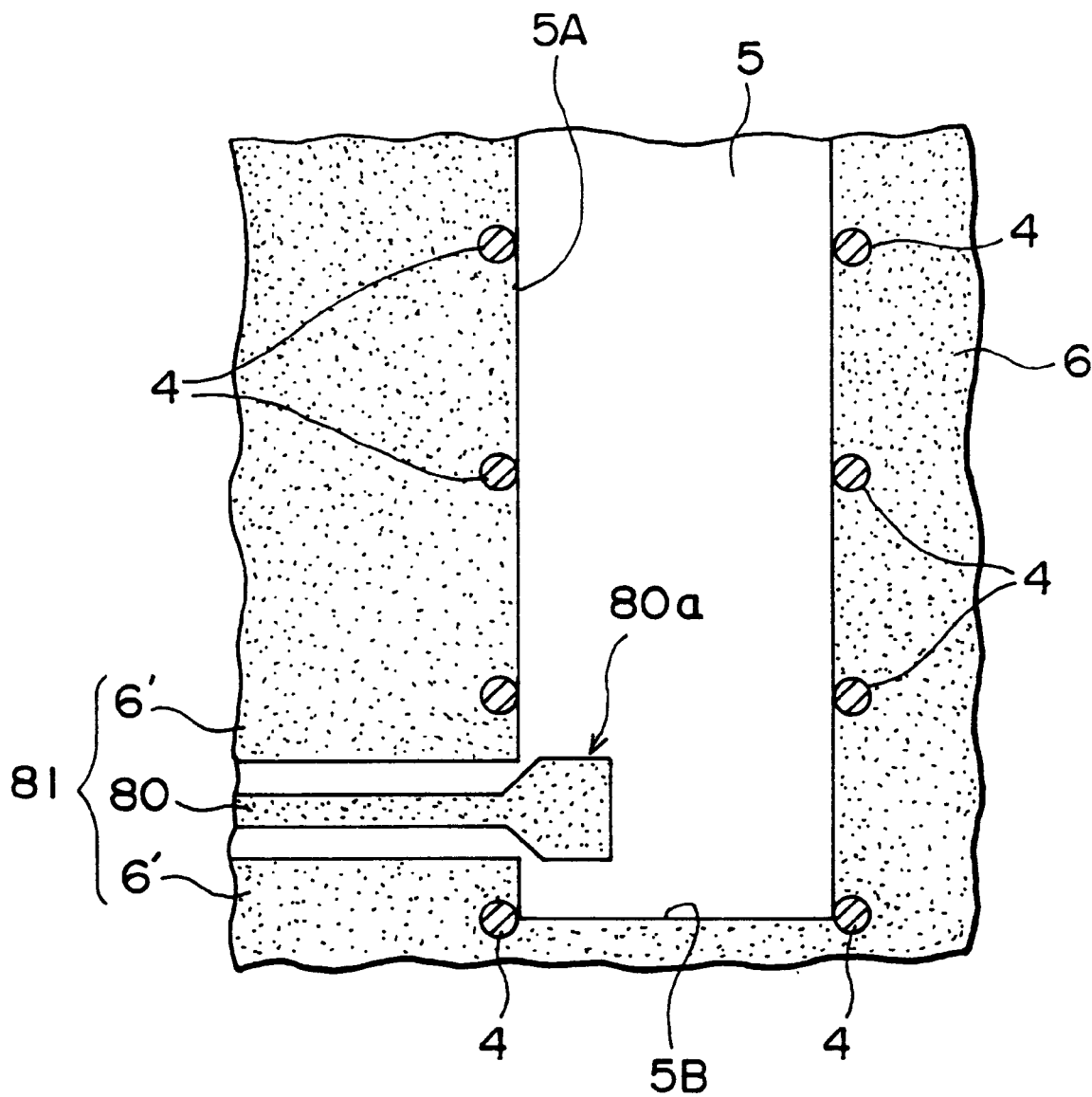
FIG. 10 is a view showing another example of the form of a stub at the tip of a linear conductor passage shown by FIGS. 8 and 9.

In FIGS. 8 and 9, the stub 80a of the linear conductor passage 80 is formed in the same width as the other portions, but as shown in FIG. 10, it may be formed in a shape broader than the other portions.

According to this invention, instead of the coplanar line 81 in FIGS. 8 and 9, a microstrip line may be applied. This example is shown in FIG. 11.

Figure 11:
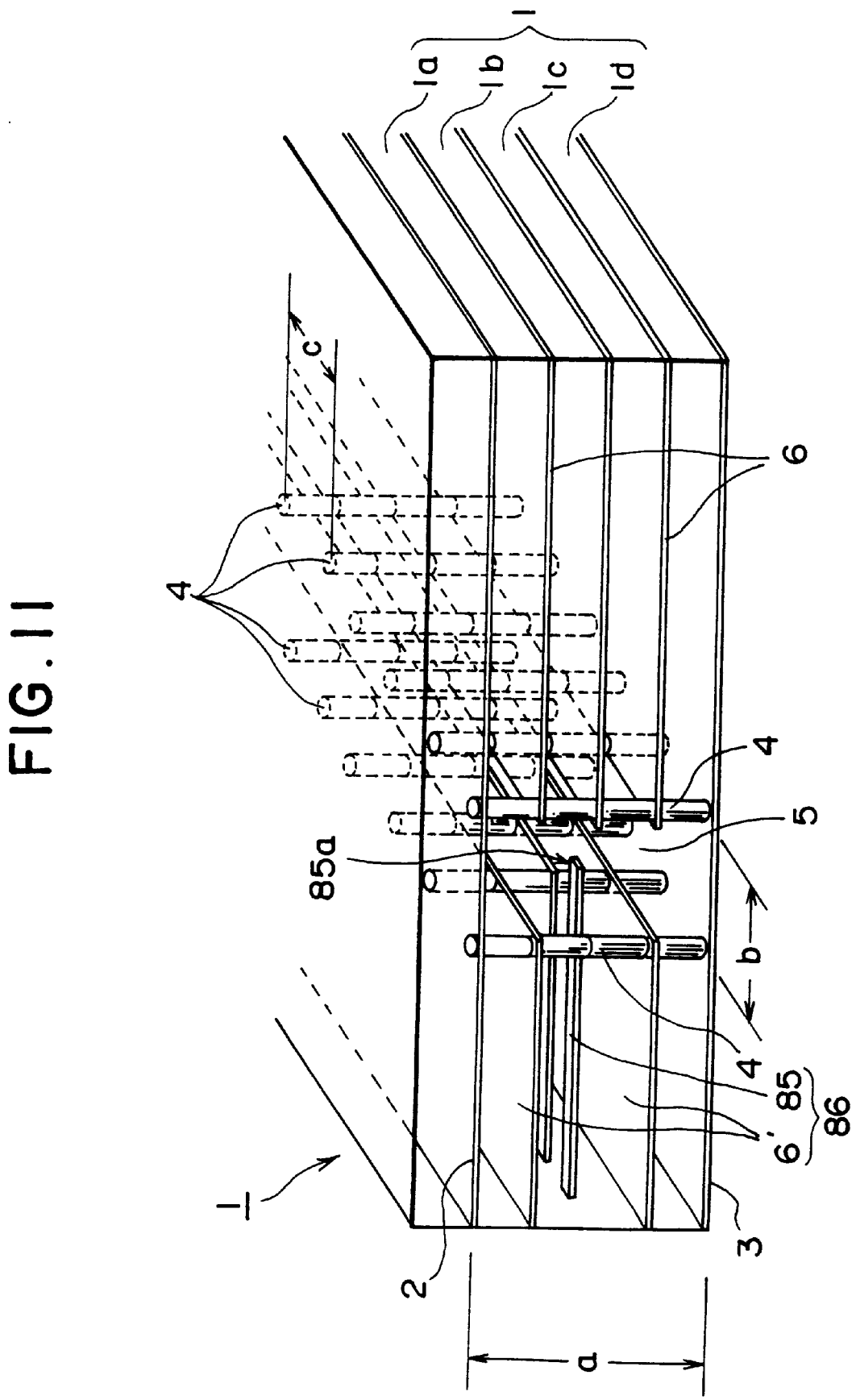
FIG. 11 is a rough perspective view showing an example of a combined structure obtained by inserting the terminal portion of a microstrip line into a transmission line by a laminated waveguide.

In FIG. 11, a linear conductor passage 85 is provided in a part of the dielectric layer, and this linear conductor passage 85 and a part 6' of the sub-conductor 6 form a microstrip line 86. The stub 85a at the tip of the linear conductor passage 85 is inserted into the transmission line 5 in the same way as in FIGS. 8 and 9.

In this case, an electromagnetic wave propagated on the strip line 86 vibrates the stub 85a to generate a concentric magnetic field. Thus, this magnetic field is combined with a magnetic field of a mode in which the magnetic field is propagated on the transmission line 5 whereby the strip line 86 can be well combined with the transmission line 5 by the laminated waveguide. Furthermore, in FIG. 11, the stub 85a can be inserted from the end surface 5B of the transmission line 5, and its shape can be made broad as shown in FIG. 10.

In the above-mentioned examples shown in FIGS. 5 to 11, another transmission line is combined with a transmission line 5 by the laminated waveguide by using the connecting via-hole or a conductor passage such as a linear conductor passage. A slot hole is provided in the main conductive layer 2 or 3 constituting the transmission line 5, and by utilizing electromagnetic coupling through this slot hole, another transmission line may be combined with the transmission line 5.

Figure 12:
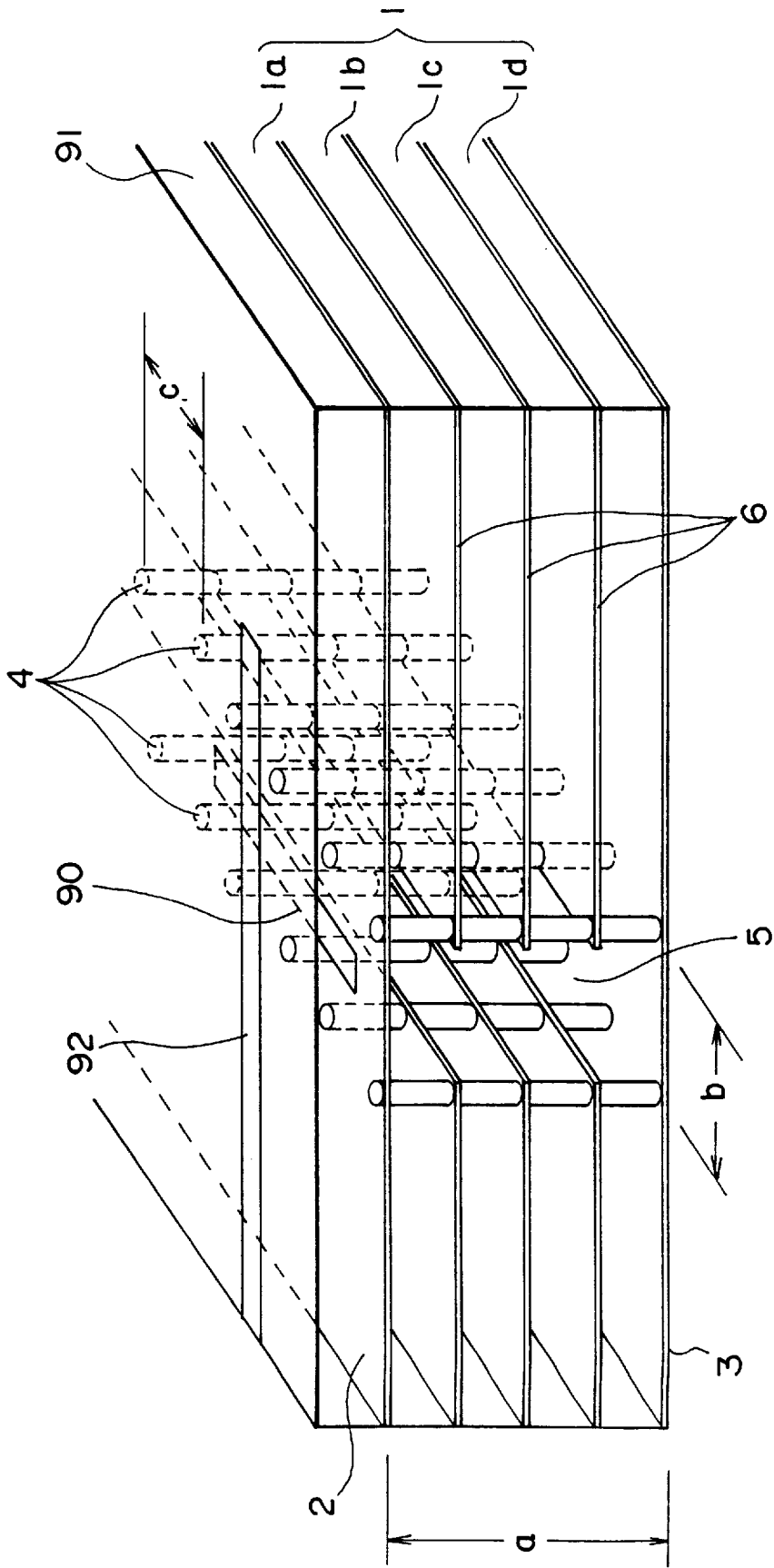
FIG. 12 is a rough perspective view showing a combined structure in as TE10 mode, obtained by combining a transmission line by a laminated waveguide with a microstrip line via a slot hole.
Figure 13:
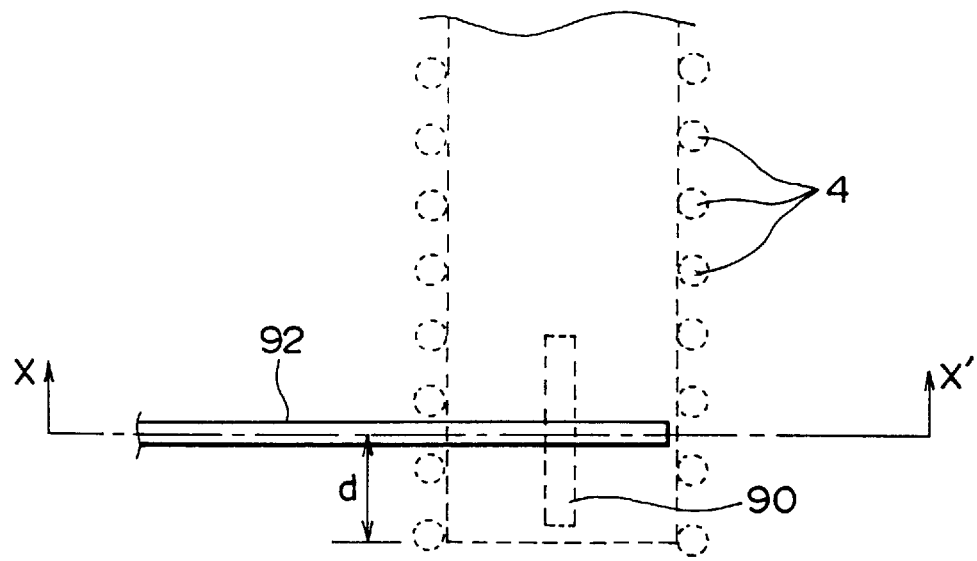
FIG. 13 is a flat sectional view of FIG. 12.
Figure 14:
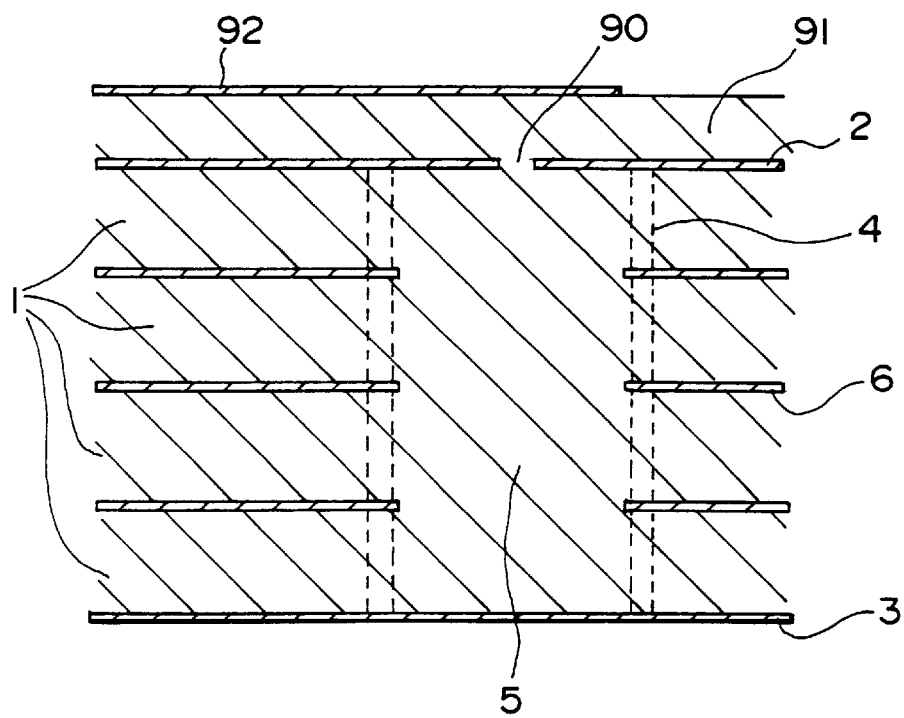
FIG. 14 is a side sectional view in an X-X' section of FIG. 13.

FIGS. 12, 13 and 14 show a combined structure of a TE10 mode in which the E surface is the main layer surface, between the transmission line 5 by the laminated waveguide and the microstrip line. FIG. 12 is a rough perspective view, FIG. 13 is its flat sectional view, FIG. 14 is a side sectional view showing a X-X' sectional surface in FIG. 13.

As is clear from FIGS. 12 to 14, the dielectric substrate 1 is composed of four dielectric layers 1a, 1b, 1c and 1d, and the main conductive layer 2 is formed on the upper surface of the dielectric substrate 1 and the main conductive layer 3 is formed on the lower surface of the dielectric substrate 1. The sub-conductive layer 6 is formed between the dielectric layers. A pseudo-conductor wall is formed by a lattice comprising the row of via-holes 4 and the sub-conductive layer 6. Namely, in FIGS. 12 to 14, the transmission line 5 having a thickness (a) and a width of (b) is formed. In FIG. 13, the side surface of the transmission line 5 is referred to as 5A, and the end surface of the transmission line 5 is referred to as 5B.

In this embodiment, the main conductive layer 2 has a slot hole 90 formed along the transsmitting direction of the transmission line 5. The longitudinal direction of the slot hole 90 is parallel to the transmitting direction of the transmission line 5. On the main conductive layer 2, the dielectric layer 91 is formed, and on this dielectric layer 91, the linear conductor passage 92 is formed so that its end portion is opposite to the slot hole 90. As is clear from FIG. 13, the linear conductor passage 92 extends diametrically to the longitudinal direction of the slot hole 90. In such a combined structure, the linear conductor passage 92 forms a microstrip line having the main conductive layer 2 as a ground conductor 2.

According to this invention, the transmission line 5 by the laminated waveguide is combined electromagnetically with the microstrip line by the linear conductor passage 92. When the thickness (a) and the width (b) of the transmission line 5 is adjusted to a≈2b, the transmission line 5 has a structure similar to a waveguide on which TE10 (the surfaces of the main conductive layers 2, 3 are the E surface parallel to an electric field) is propagated as a main mode, and on a microstrip line by the linear conductor passage 92, an electromagnetic wave having a mode near the TEM wave is propagated. Accordingly, when the wavelength of the electromagnetic wave to be propagated is λ, the distance d from the center of the slot hole 90 to the end surface 5B is about λ/4 and the longitudinal length of the slot hole 90 is about λ/2, the microstrip line by the linear conductor passage 92 can be electromagnetically coupled with the transmission line 5. An electric wave which is reflected at the end surface 5B of the transmission line 5 and becomes an anti-phase (electric wave which proceeded in the bottom portion of FIG. 14) is superimposed on an electric wave which proceeded in the upper portion of FIG. 14 in an equivalent phase, and good transmission characteristics will be obtained.

Figure 15:
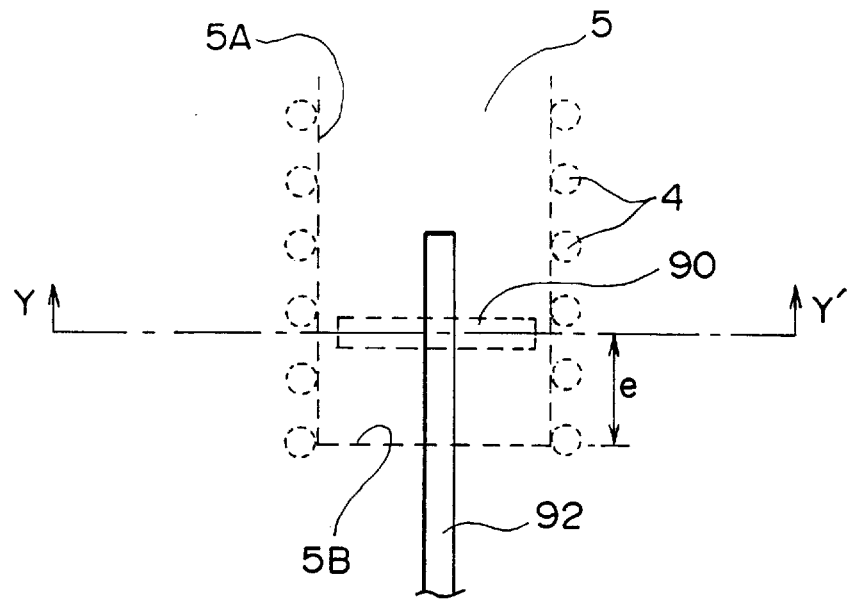
FIG. 15 is a rough flat sectional view showing a combined structure in a TE11 mode, obtained by combining a transmission line by a laminated waveguide with a microstrip line via a slot hole.

FIG. 15 shows a rough flat sectional view of a combined structure in a TE11 mode.

The combined structure of FIG. 15 corresponds to a structure resulting from changing the directions of the slot hole 90 and the linear conductor passage 92 forming the microstrip line in the combined structure shown in FIGS. 12 to 14. In FIG. 15, the slot hole 90 formed in the main conductive layer 2 is such that its longitudinal direction crosses the transmission line 5 at right angles to each other, and the linear conductor passage 92 provided in the dielectric layer 91 on the main conductive layer 2 extends along the transmitting direction of the transmission line 5 from the side of the end surface 5B of the transmission line 5. Accordingly, when in this combined structure, the distance e between the slot hole 90 and the end surface 5B of the transmission line 5 is adjusted to about $\lambda/4$ ($\lambda$=the wavelength of an electromagnetic wave to be propagated), the microstrip line is combined with the transmission line 5 by the laminated waveguide in a TM11 mode.

FIGS. 12 to 15 explained above show an example of combining the microstrip line with the transmission line 5, but this combining method can also be applied to a coplanar line.

Figure 16:
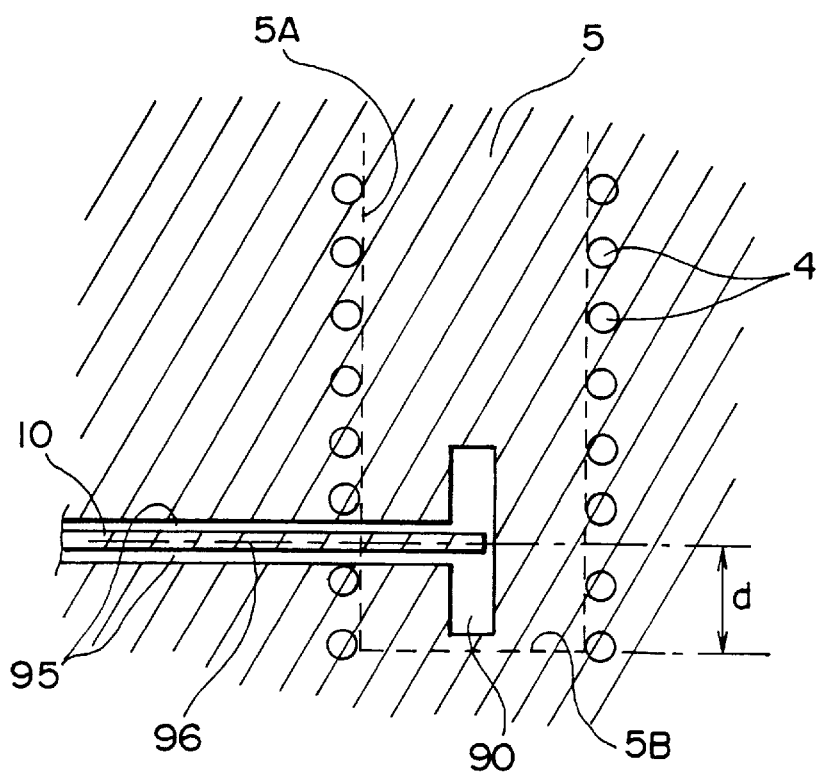
FIG. 16 is a rough flat sectional view showing a combined structure in a TE10 mode, obtained by combining a transmission line by a laminated waveguide with a coplanar line via a slot hole.

FIG. 16 shows a rough flat sectional view which depicts a combined state between a coplanar line and a transmission line 5 by the laminated waveguide in a TM10 mode.

In FIG. 16, the slot hole 90 extending along the transmitting direction of the transmission line 5 is formed in the upper main conductive layer 2 of the transmission line 5 by the laminated waveguide as shown in FIG. 13, and the notch portion 95 for the coplanar line is placed astride the slot hole 90 at right angles. The linear conductor passage 96 extends through the notch portion 95, and its tip portion intrudes into the slot hole 90. Accordingly, the linear conductor passage 96 forms a coplanar line using the main conductive layer 2 as a ground conductor.

Figure 17:
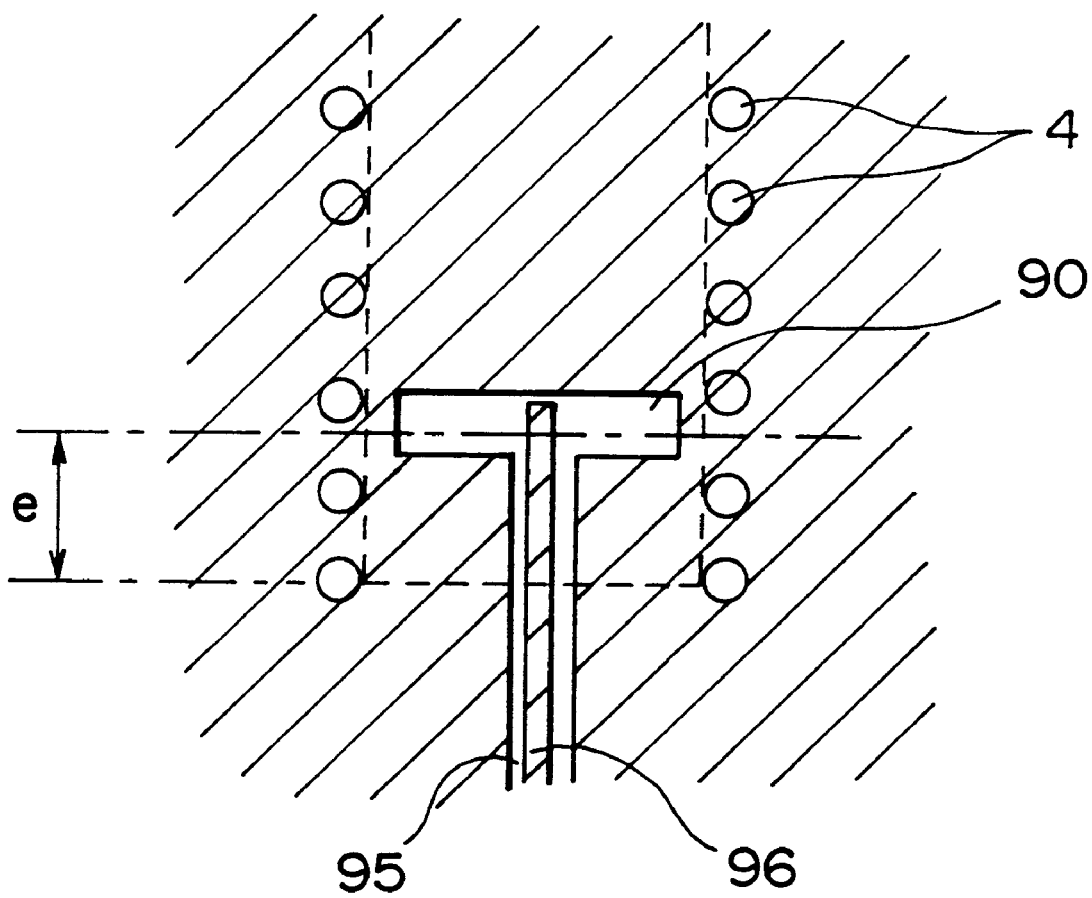
FIG. 17 is a rough flat sectional view showing a combined structure in a TE10 mode, obtained by combining a transmission line by a laminated waveguide with a coplanar line via a slot hole.

FIG. 17 shows a rough flat sectional view of a combined state between the coplanar line and the transmission line by the laminated waveguide in a TM11 mode. In the example of FIG. 17, the positions of the slot hole 90 and the coplanar line by the linear coductor passage 96 are different from the example of FIG. 16. Referring to FIG. 17, in the slot hole 90, its longitudinal direction crosses the transmitting direction of the transmission line 5 at right angles to each other, and the linear conductor passage 95 forming the coplanar line extends along the transmitting direction of the transmitting line 5 from the side of the end surface 5B of the transmission line 5, and its tip end portion intrudes into the slot hole 90.

In the combination method shown in FIGS. 16 and 17, by adjusting the distance d (FIG. 16) between the linear conductor passage 96 and the end surface 5B of the transmission line 5 or the distance e (FIG. 17) between the slot hole 90 and the end surface 5B of the transmission line 5 to about $\lambda/4$ ($\lambda$=the wavelength of an electromagnetic wave to be propagated) in the same way as in the embodiment of FIG. 12 to 15, the coplanar line and the transmission line 5 by the laminated waveguide are electromagnetically coupled in the TM10 or TM11 mode.

As explained hereinabove, the wiring board of this invention provided with the transmission line 5 by the laminated waveguide as shown in FIG. 1 can be combined with another transmission line formed in the board, or a transmission line formed in the wiring board by various means.

Accordingly, the microstrip line or the coplanar line formed on the surface of the wiring board can be electrically connected to an IC element or a high-frequency element mounded on the surface of the wiring board, and via the microstrip line or the coplanar line, signals can be effectively transmitted between the transmission line 5 by the laminated waveguide and the IC element or the high-frequency element.

Production of the Wiring Board

The above-mentioned wiring board having the transmission line by the laminated waveguide can be produced easily by a lamination technology by using ceramics with high productivity.

Figure 18:
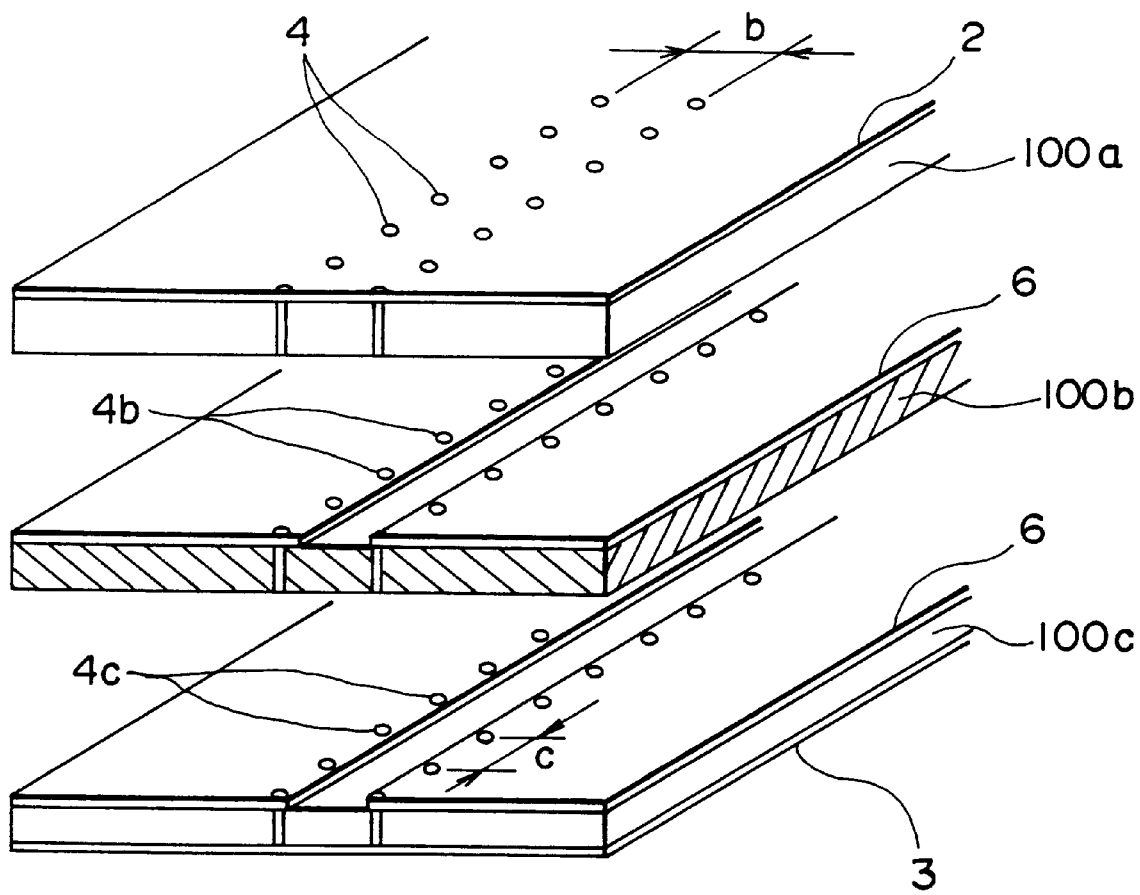
FIG. 18 is a rough view for explaining the process for producing the wiring board shown in FIG. 1.

FIG. 18 is a rough view showing a process for producing the wiring board of FIG. 1. By taking the wiring board of FIG. 1 as an example, the process for producing the wiring board of this invention will be described.

A sheet-like molded product (green sheet) 100 was prepared from a ceramic powder capable of forming a dielectric substrate 1 by a doctor blade method or a rolling method. Thereafter, the green sheet 100 was printed and coated with a metalizing ink according to a dielectric layer constituting the dielectric substrate 1 to form a metalized ink layer corresponding to a main conductive layer or a sub-conductive layer. Simultaneously, a hole was formed in the green sheet 100, and the metalized ink was filled. The hole filled with the metalized ink becomes a via-hole.

As specificaly explained, in the green sheet 100A corresponding to the dielectric layer 1a in FIG. 1, the main conductive layer 2 is formed over the entire surface of the upper surface, and the hole filled with the metalized ink is formed. The holes are provided in two rows with a distance of b, and the holes in each row are provided with a distance of c. In a green sheet 100B corresponding to the dielectric body layer 1b in FIG. 1, the sub-conductive layer 6 is formed in a region excepting a portion for forming the transmission line having a width of b, and furthermore, at the side of its line, a hole filled with the metalized ink is formed at a position electrically connected to the sub-conductive layer 6 in the same way as the green sheet 100A. Furthermore, on the upper surface of the green sheet 100C corresponding to the dielectric body layer 1c in FIG. 1, the sub-conductive layer 6 is formed, and on its entire surface of the lower surface, the main conductive layer 3 is formed, and at the side of its line, a hole filled with the metalized ink is formed in the same way as in the green sheet 100A and 100B so that the sub-conductive layer 6 may be electrically connected to the main conductive layer 3.

The green sheets formed in the above way are laminated so that the holes (via-holes 4) filled with the metalized ink may be adjusted. Thereafter, these green sheets were simultaneously fired to give a wiring board having the structure shown in FIG. 1.

When the wiring board is produced by a co-firing technique, for example if the dielectric ceramic is alumina, the main conductive layer, the sub-conductive layer and the via-hole are formed by a high melting metal such as W or Mo. If the dielectric ceramic is a glass-ceramic, the main conductive layer, the sub-conductive layer, and the via-hole may be formed from a low melting metal such as copper or silver. In FIG. 18, the green sheets are laminated so that the via-hole 4 of each green sheet is adjusted. However, as far as the via-hole 4 and the sub-conductor 6 are electrically connected each other, the via-holes 4 is not slightly in its proper position.

With regard to FIG. 18, explanation has been made by paying attention only to the wiring board shown in FIG. 1, but it is apparent to those skilled in the art that such a method can be applied to the laminated waveguide shown in FIG. 2 or to the production of a wiring board by combining the transmission line with the transmission line by the laminated waveguide by the combination method shown in FIGS. 5 to 17.

EXAMPLES

Comparative Example 1

Figure 19:
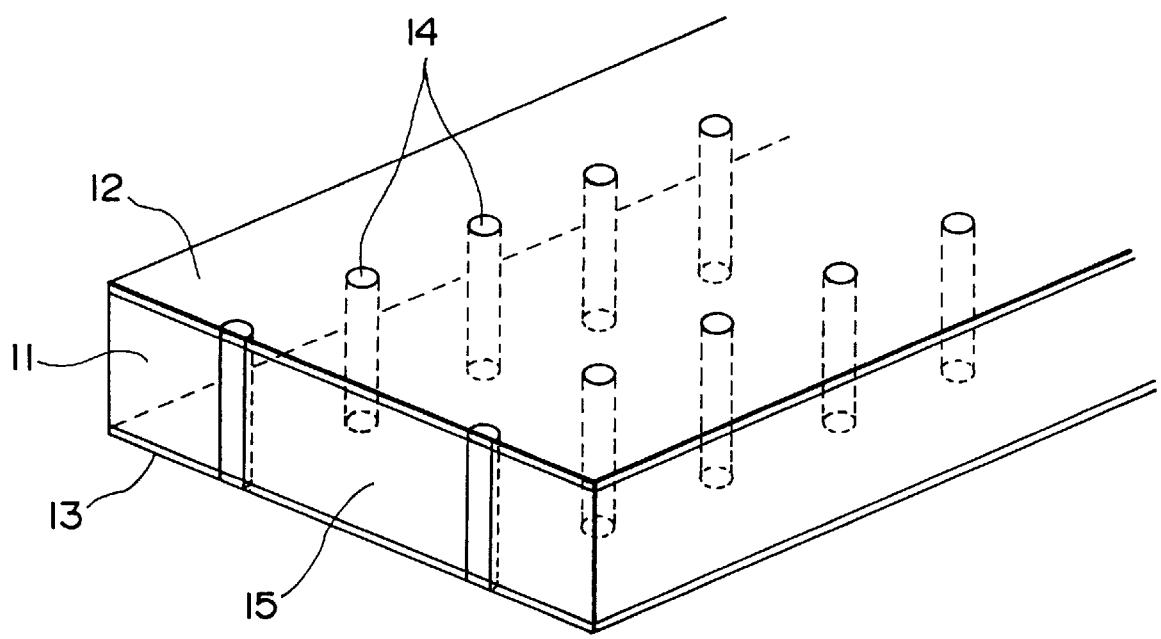
FIG. 19 is a rough perspective view showing a transmission line by a hitherto known laminated waveguide.

Using a glass-ceramic having a dielectric constant of 9.6 and a dielectric loss tangent (tan δ) of 0.006 at 40 GHz as a dielectric substrate, a main conductive layer and a via-hole were formed by using copper metalize, and these materials were co-fired simultaneously at 900° C. to form a wiring board having a transmission line shown in FIG. 19. In this wiring board, a sub-conductive layer was not formed.

$f \cdot \in^{1/2} \tan\delta$ of this wiring board is 0.8 or below at 0 to 43 GHz of the frequency f.

Furthermore, the thickness (a) of the dielectric substrate 1 is a=1 mm, the width (b) of the line is b=2 mm (corresponding to WRJ-34 standard), the distance (c) of the via-hole is c=1 mm, the diameter of the via-hole is 0.16, and the length of the transmission line is 25 mm.

Figure 20:
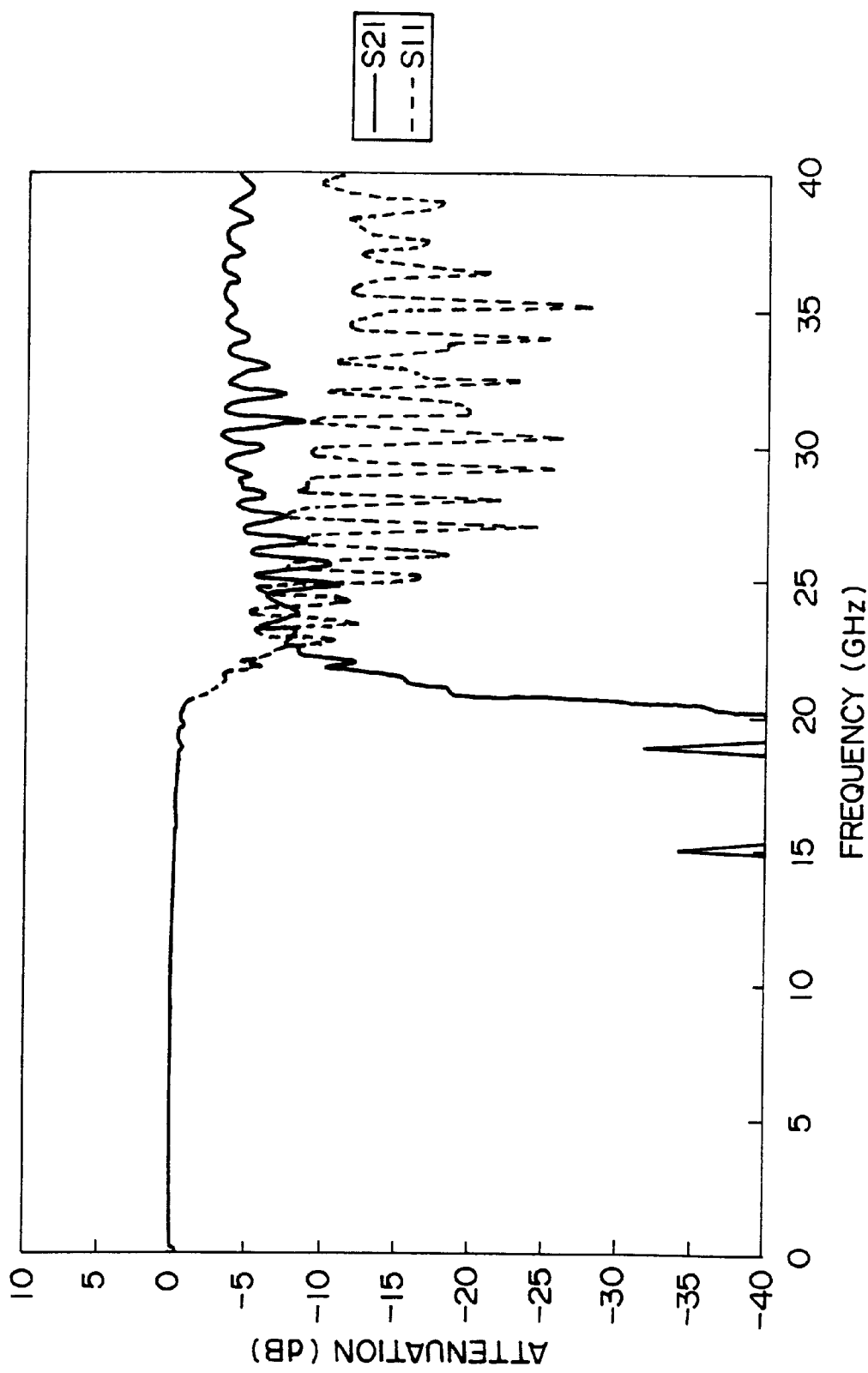
FIG. 20 is a view showing the transmitting characteristics of transmission line in a wiring board (the wiring board in FIG. 19) of Comparative Example 1.

The results of the characteristics of the waveguide line were evaluated and shown in FIG. 20.

The loss of the input portion of the waveguide is considered to be about −1 dB, but at a frequency of at least 30 GHz, S21 is about −5 dB.

Example 1

The constitutions of the layers were as shown in FIG. 1 and two sub-conductive layers were formed on both sides of the transmission line. Otherwise, in the same way as in Comparative Example 1, a wiring board having the same size was formed. Incidentally, the dielectric ceramic substrate 1 was formed from three layers each having a thickness of 0.33 mm which were laminated.

Figure 21:
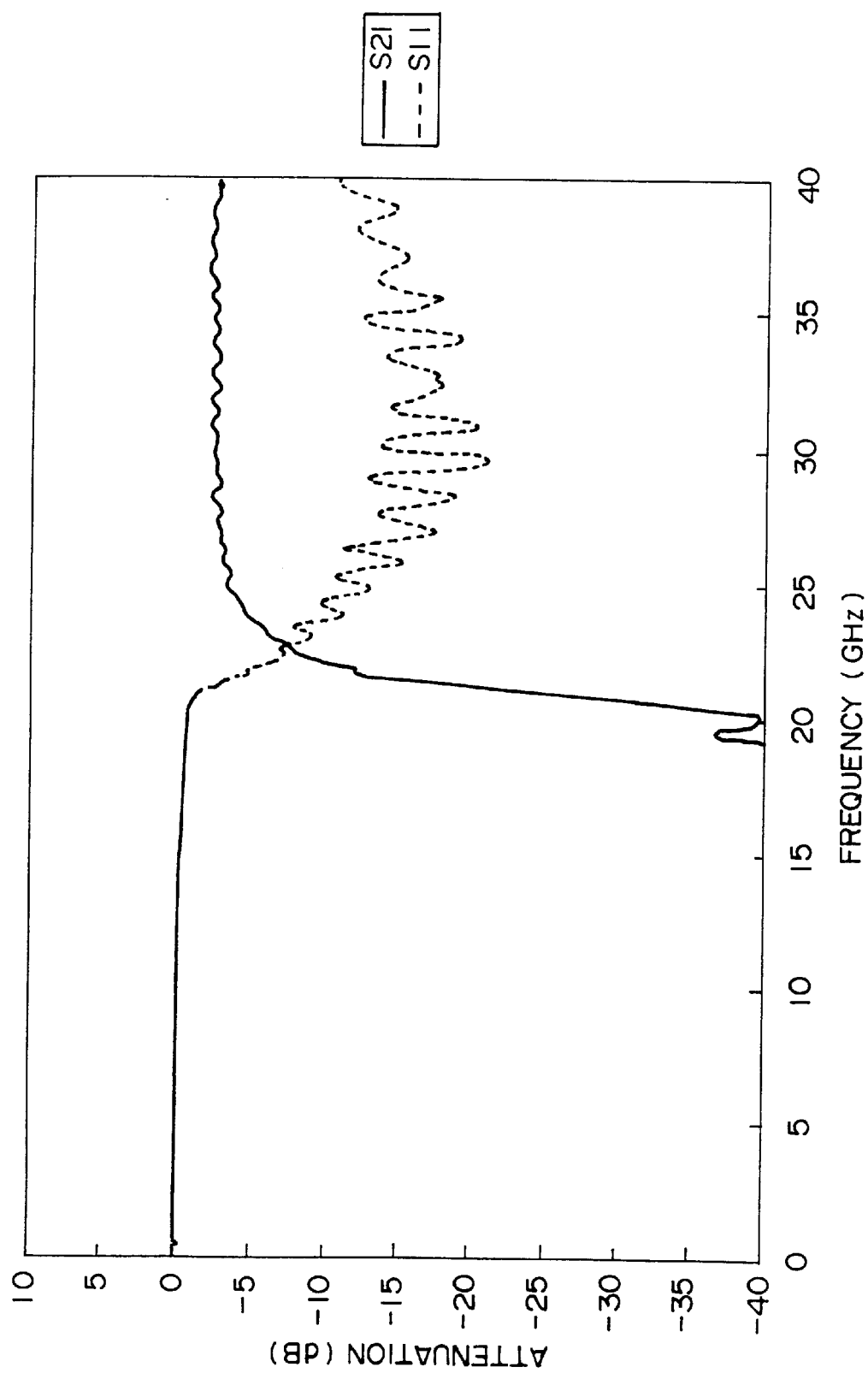
FIG. 21 is a view showing the transmitting characteristics of a transmission line in the wiring board (the wiring board in FIG. 1) of Example 1.

FIG. 21 shows the results in which transmission characteristics of the transmission line in the resulting wiring board were evaluated.

As is clear from the results of FIG. 21, excellent characteristics of S21 being about −2.5 dB in a wavelength region of 25 GHz to 40 GHz. Especially, in a high-frequency region of at least 25 GHz, S21 was flat and the characteristics against variations of the frequency were stable. In this way, it is understood that in comparison with Comparative Example 1 in which a sub-conductive layer was not provided, the wiring board of this invention showed excellent transmitting characteristics.

Example 2

Using a ceramic tape having a thickness of 0.3 mm and a Cu metalized ink, a wiring board in which a dielectric substrate 1 was composed of four dielectric layers, and a transmission line having a crosssectional shape of 1.2 mm×1.2 mm was provided was prepared in the same way as in Example 1. In the preparation of the wiring board, the dielectric constant of the dielectric layer adjacent to the main conductive layer in the upper portion and the main conductive layer in the lower portion was adjusted to 5, and the dielectric constants ∈H of two dielectric layers in the central portion were variously changed. The dielectric loss tangents tanδ of the dielectric layers were all 5×10⁻⁴.

Figure 22:
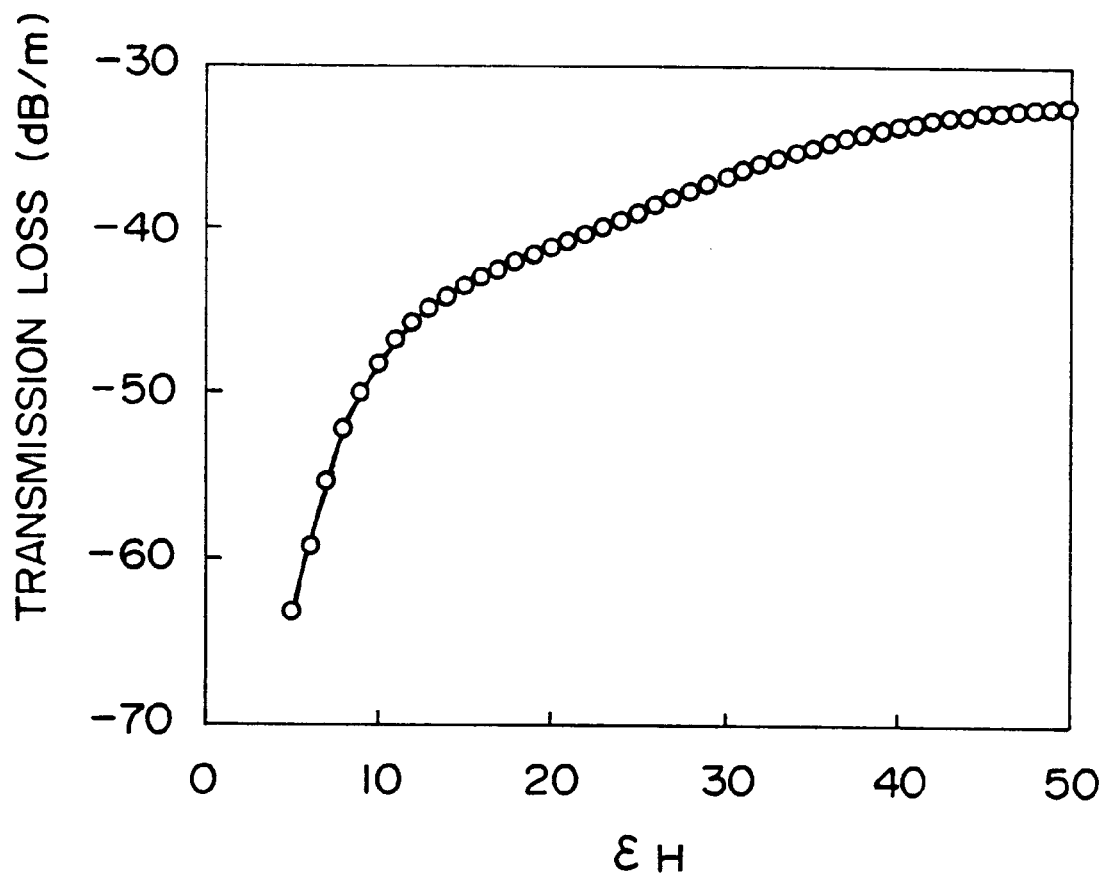
FIG. 22 is a view showing the relation between the dielectric constant ∈H of the dielectric layer in the central portion and transmission loss in the wiring board prepared in Example 2.

With respect to the resulting wiring board, the transmission loss at a frequency of 60 GHz was calculated and the result is shown in FIG. 22. The transmission loss was calculated by the formula of the electromagnetic field. At this time, since the side surface of the transmission line was formed from the via-hole, calculation was performed by increasing the conductor resistance three times higher.

As shown in FIG. 22, when ∈H=5, namely the inside of the transmission line was composed of the same dielectric layers, the transmitting loss is −63 dB/m. But when the dielectric constant ∈H of the dielectric layer in the central portion is made higher, the transmitting loss decreases.

What is claimed is:

1. A wiring board equipped with a laminated waveguide as a high-frequency signal transmission line, wherein the laminated waveguide comprises:

a dielectric substrate, a pair of main conductive layers laminated on the upper surface and the lower surface of the dielectric substrate, a plurality of via-holes extending in a thickness direction in the dielectric substrate so that the plurality of via-holes electrically connect each other and connect the pair of main conductive layers, and a sub-conductive layer provided in the dielectric substrate so that the sub-conductive layer is parallel to the main conductive layers and is electrically connected to the via-holes; wherein the plurality of the via-holes form two rows extending in a signal transmitting direction with a mutual distance from each other, and the distance between adjacent via-holes in each row is adjusted to less than ½ of a signal wavelength, a region surrounded by the pair of the main conductive layers and the two rows of the via-holes forms a signal transmitting region, and on both sides in the outside of the signal transmitting region, the sub-conductive layer is provided.

2. A wiring board according to claim 1, wherein the dielectric substrate is formed by laminating a plurality of dielectric layers, the dielectric layer positioned at the central portion in the signal transmitting region has a higher dielectric constant than the other dielectric layers, and the sub-conductive layer is provided between the layers of the individual dielectric layers.

3. A wiring board according to claim 1, wherein the board has another high-frequency signal transmission line together with the laminated waveguide, at least one of the main conductive layers of the laminated waveguide has a hole or notched portion, a connecting via-hole is provided in the terminal portion of the other high-frequency signal transmission line, the connecting via-hole is inserted into the signal transmitting region of the laminated waveguide through the hole or notched portion so that the connecting via-hole does not contact the main conductive layer, and another high-frequency signal transmission line is coupled with the laminated waveguide by the connecting via-hole.

4. A wiring board according to claim 3, wherein the other high-frequency signal transmission line is a strip line, a microstrip line, a coplanar line, a grounded coplanar line, or a laminated waveguide.

5. A wiring board according to claim 1, wherein the board has another high-frequency signal transmission line together with the laminated waveguide, and the terminal portion of the other high-frequency signal transmission line is inserted into the signal transmitting region through the dielectric body substrate of the laminated waveguide whereby the other high-frequency signal transmission line is coupled with the laminated waveguide.

6. A wiring board according to claim 5, wherein the other high-frequency signal transmission line is a strip line, a microstrip line, a coplanar line, a grounded coplanar line, or a laminated waveguide.

7. A wiring board according to claim 1, wherein the board has another high-frequency signal transmission line together with the laminated waveguide, a slot hole is formed in one of the main conductive layers, and the other high-frequency signal transmission line is electromagnetically coupled with the laminated waveguide through the slot hole.

8. A wiring board according to claim 7 wherein the other high-frequency signal transmission line is a strip line, a microstrip line, a coplanar line, or a grounded coplanar line.

9. A wiring board equipped with a laminated waveguide as a high-frequency signal transmission line, wherein the laminated waveguide includes a laminated structure comprising:

dielectric layers and conductive layers laminated alternately, and a plurality of via-holes extending parallel in a laminating direction and circumferentially spaced from each other, wherein each conductive layer is positioned at the outside of the via-holes and electrically connected to the via-holes, and by a region surrounded with the via-holes and the conductive layers, high-frequency signals are transmitted in a laminated direction using the dielectric layers.

10. A wiring board equipped with a laminated waveguide as a high-frequency signal transmission line, wherein the laminated waveguide comprises:

a dielectric substrate;

a pair of main conductive layers laminated on the upper surface and the lower surface of the dielectric substrate;

a plurality of via-holes extending in a thickness direction in the dielectric substrate so that the plurality of via-holes electrically connect the main conductive layers, and a sub-conductive layer provided in the dielectric substrate so that the sub-conductive layer is parallel to the main conductive layers and is electrically connected to the via-holes; wherein the plurality of the via-holes form two rows extending in a signal transmitting direction with a mutual distance from each other, and the distance between adjacent via-holes in each row is adjusted to less than ½ of a signal wavelength, a region surrounded by the pair of the main conductive layers and the two rows of the via-holes forms a signal transmitting region, and on both sides in the outside of the signal transmitting region, the sub-conductive layer is provided, and wherein the dielectric substrate is formed by laminating a plurality of dielectric layers, at least one dielectric layer positioned in the inner portion in the signal transmitting region having a higher dielectric constant than the other dielectric layers, and the sub-conductive layer is provided between the layers of the individual dielectric layers.

11. A wiring board according to claim 10, wherein the board has another high-frequency signal transmission line together with the laminated waveguide, at least one of the main conductive layers of the laminated waveguide has a hole or notched portion, a connecting via-hole is provided in the terminal portion of the other high-frequency signal transmission line, the connecting via-hole is inserted into the signal transmitting region of the laminated waveguide through the hole or notched portion so that the connecting via-hole does not contact the main conductive layer, and another high-frequency signal transmission line is coupled with the laminated waveguide by the connecting via-hole.

12. A wiring board according to claim 11, wherein the other high-frequency signal transmission line is a strip line, a microstrip line, a coplanar line, a grounded coplanar line, or a laminated waveguide.

13. A wiring board according to claim 10, wherein the board has another high-frequency signal transmission line together with the laminated waveguide, and the terminal portion of the other high-frequency signal transmission line is inserted into the signal transmitting region through the dielectric body substrate of the laminated waveguide whereby the other high-frequency signal transmission line is coupled with the laminated waveguide.

14. A wiring board according to claim 13, wherein the other high-frequency signal transmission line is a strip line, a microstrip line, a coplanar line, a grounded coplanar line, or a laminated waveguide.

15. A wiring board according to claim 10, wherein the board has another high-frequency signal transmission line together with the laminated waveguide, a slot hole is formed in one of the main conductive layers, and the other high-frequency signal transmission line is electromagnetically coupled with the laminated waveguide through the slot hole.

16. A wiring board according to claim 15 wherein the other high-frequency signal transmission line is a strip line, a microstrip line, a coplanar line, or a grounded coplanar line.

* * * * *